(12) United States Patent
Nakamura et al.

(10) Patent No.: US 12,332,520 B2
(45) Date of Patent: *Jun. 17, 2025

(54) OPTICALLY ANISOTROPIC LAYER, OPTICAL FILM, POLARIZING PLATE, AND IMAGE DISPLAY DEVICE

(71) Applicant: FUJIFILM Corporation, Tokyo (JP)

(72) Inventors: Yuki Nakamura, Kanagawa (JP); Masaaki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 154 days.

This patent is subject to a terminal disclaimer.

(21) Appl. No.: 17/701,127

(22) Filed: Mar. 22, 2022

(65) Prior Publication Data

US 2022/0220381 A1 Jul. 14, 2022

Related U.S. Application Data

(63) Continuation of application No. PCT/JP2020/036155, filed on Sep. 25, 2020.

(30) Foreign Application Priority Data

Sep. 27, 2019 (JP) ................................. 2019-177718

(51) Int. Cl.
*G02F 1/13363* (2006.01)
*C09K 19/02* (2006.01)
(Continued)

(52) U.S. Cl.
CPC ........ *G02F 1/133633* (2021.01); *C09K 19/02* (2013.01); *C09K 19/04* (2013.01);
(Continued)

(58) Field of Classification Search
CPC ..................................................... C09K 19/04
See application file for complete search history.

(56) References Cited

U.S. PATENT DOCUMENTS 10,473,820 B2 * 11/2019 Yamamoto ........... C09D 135/02
2015/0079380 A1 3/2015 Muramatsu et al.
(Continued)

FOREIGN PATENT DOCUMENTS

JP 2010-031223 A 2/2010
JP 2015-200861 A 11/2015
(Continued)

OTHER PUBLICATIONS

Machine Translation of JP 2018146636 (Year: 2023).*
(Continued)

*Primary Examiner* — Chanceity N Robinson
(74) *Attorney, Agent, or Firm* — Edwards Neils LLC; Jean C. Edwards, Esq.

(57) ABSTRACT

An optically anisotropic layer in which the occurrence of a haze is suppressed and a winding aptitude is excellent; and an optical film, a polarizing plate, and an image display device, each having the optically anisotropic layer. The optically anisotropic layer is obtained by polymerizing a polymerizable liquid crystal composition containing a polymerizable liquid crystal compound, in which in a case where an amplitude value at each wavelength determined by subjecting data of a three-dimensional surface roughness to a Fourier transform is defined as L, the amplitude value L at a wavelength of 5 μm or more is 0.125 or more, and the amplitude value L at a wavelength of 2.0 to 2.5 μm is 0.025 or less.

17 Claims, 1 Drawing Sheet

(51) Int. Cl.
   *C09K 19/04*    (2006.01)
   *G02F 1/1333*   (2006.01)
   *G02F 1/1335*   (2006.01)
   *G02F 1/137*    (2006.01)
   *H10K 59/80*    (2023.01)

(52) U.S. Cl.
   CPC .. *G02F 1/133365* (2013.01); *G02F 1/133528* (2013.01); *G02F 1/137* (2013.01); *C09K 2019/0448* (2013.01); *H10K 59/8791* (2023.02)

(56) References Cited

U.S. PATENT DOCUMENTS

| | | |
|---|---|---|
| 2016/0068756 A1 | 3/2016 | Moriya et al. |
| 2018/0201701 A1 | 7/2018 | Muramatsu et al. |
| 2020/0369962 A1 | 11/2020 | Hayashi et al. |
| 2020/0392408 A1* | 12/2020 | Shibata ................ G02B 5/3016 |
| 2022/0010209 A1 | 1/2022 | Fukushima et al. |
| 2022/0011488 A1 | 1/2022 | Yamamoto et al. |

FOREIGN PATENT DOCUMENTS

| | | | | |
|---|---|---|---|---|
| JP | 2016-051178 A | | 4/2016 | |
| JP | 2018146636 A | * | 9/2018 | |
| JP | 2018146637 A | * | 9/2018 | |
| WO | 2017/057545 A1 | | 4/2017 | |
| WO | 2019/163878 A1 | | 8/2019 | |
| WO | WO-2019167926 A1 | * | 9/2019 | ....... B32B 17/10458 |
| WO | 2020/203491 A1 | | 10/2020 | |
| WO | 2020/203519 A1 | | 10/2020 | |

OTHER PUBLICATIONS

International Search Report issued in PCT/JP2020/036155 on Dec. 15, 2020.
Written Opinion issued in PCT/JP2020/036155 on Dec. 15, 2020.
International Preliminary Report on Patentability completed by WIPO on Mar. 15, 2022 in connection with International Patent Application No. PCT/JP2020/036155.

* cited by examiner

OPTICALLY ANISOTROPIC LAYER, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2020/036155 filed on Sep. 25, 2020, which was published under PCT Article 21 (2) in Japanese, and which claims priority under 35 U.S.C. § 119 (a) to Japanese Patent Application No. 2019-177718 filed on Sep. 27, 2019. The above applications are hereby expressly incorporated by reference, in its their entirety, into the present application.

BACKGROUND OF THE INVENTION

1. Field of the Invention

The present invention relates to an optically anisotropic layer, an optical film, a polarizing plate, and an image display device.

2. Description of the Related Art

Optical films such as an optical compensation sheet and a phase difference film are used in various image display devices in order to eliminate image coloration or expand a viewing angle.

A stretched birefringent film has been used as the optical film, but in recent years, it has been proposed to use an optical film having an optically anisotropic layer consisting of a liquid crystal compound instead of the stretched birefringent film.

As such an optically anisotropic layer, for example, an optically anisotropic layer in which a polymerizable composition including one or more polymerizable rod-shaped liquid crystal compounds exhibiting a smectic phase is immobilized in a state of exhibiting a smectic phase is described in JP2015-200861A ([Claim 1]).

In addition, a phase difference film in which a liquid crystal compound exhibiting a smectic phase is immobilized in the smectic phase and includes a non-liquid crystal compound satisfying a predetermined condition is described in JP2016-051178A ([Claim 1]).

SUMMARY OF THE INVENTION

The present inventors have conducted investigations on a winding aptitude of the optically anisotropic layer described in JP2015-200861A and the phase difference film described in JP2016-051178A, and have thus clarified that in a case of adopting a method of imparting roughness to the surface, a haze occurs depending on a size of the roughness, and a transparency may be deteriorated in some cases.

Therefore, an object of the present invention is to provide an optically anisotropic layer in which the occurrence of a haze is suppressed and a winding aptitude is excellent; and an optical film, a polarizing plate, and an image display device, each having the optically anisotropic layer.

The present inventors have conducted intensive investigations to accomplish the object, and as a result, they have found that by providing a surface with roughness in which an amplitude value at each wavelength determined by subjecting data of a three-dimensional surface roughness to a Fourier transform is in a predetermined range, the occurrence of a haze is suppressed and a winding aptitude is improved, thereby completing the present invention.

That is, the present inventors have found that the object can be accomplished by the following configurations.

[1] An optically anisotropic layer obtained by polymerizing a polymerizable liquid crystal composition containing a polymerizable liquid crystal compound, in which in a case where an amplitude value at each wavelength determined by subjecting data of a three-dimensional surface roughness to a Fourier transform is defined as L, the amplitude value L at a wavelength of 5.0 m or more is 0.125 or more, and the amplitude value L at a wavelength of 2.0 to 2.5 µm is 0.025 or less.

[2] The optically anisotropic layer as described in [1], in which the polymerizable liquid crystal composition is immobilized in a liquid crystal state of a smectic phase.

[3] The optically anisotropic layer as described in [1] or [2], in which the amplitude value L at a wavelength of 5.0 µm or more is 0.235 or more.

[4] The optically anisotropic layer as described in any one of [1] to [3], in which the polymerizable liquid crystal composition further contains a monofunctional compound having one polymerizable group and having two or more ring structures of at least one selected from the group consisting of an aromatic ring and an alicyclic ring.

[5] The optically anisotropic layer as described in [4], in which the number D1 of atoms of the polymerizable liquid crystal compound and the number D2 of atoms of the monofunctional compound satisfy a relationship of Expression (1), $$0.35 \le D2/D1 \le 0.45 \tag{1}$$

here, the number of atoms represents the number of atoms on a bond that links one terminal and the other terminal of the compound at a shortest distance, and hydrogen atoms are not included, and the one terminal and the other terminal refer to a starting atom and an ending atom, respectively, for which a maximum number of atoms is calculated in a case where the atoms on the bond of the compound are linked at the shortest distance, and hydrogen atoms are not included.

[6] The optically anisotropic layer as described in [4] or [5], in which the monofunctional compound has a polymerizable group and an aromatic ring which may have a substituent, the polymerizable group constitutes one terminal of a molecule, and the aromatic ring or a substituent which may be contained in the aromatic ring constitutes the other terminal of the molecule.

[7] The optically anisotropic layer as described in any one of [1] to [6], in which the polymerizable liquid crystal composition further contains an oxime ester-based polymerization initiator.

[8] The optically anisotropic layer as described in any one of [1] to [7], in which the optically anisotropic layer is a positive A plate.

[9] An optical film comprising the optically anisotropic layer as described in any one of [1] to [8].

[10] A polarizing plate comprising:
the optical film as described in [9]; and
a polarizer.

[11] An image display device comprising the optical film as described in [9] or the polarizing plate as described in [10].

According to the present invention, it is possible to provide an optically anisotropic layer in which the occurrence of a haze is suppressed and a winding aptitude is excellent; and an optical film, a polarizing plate, and an image display device, each having the optically anisotropic layer.

DESCRIPTION OF THE PREFERRED EMBODIMENTS

Figure 1:
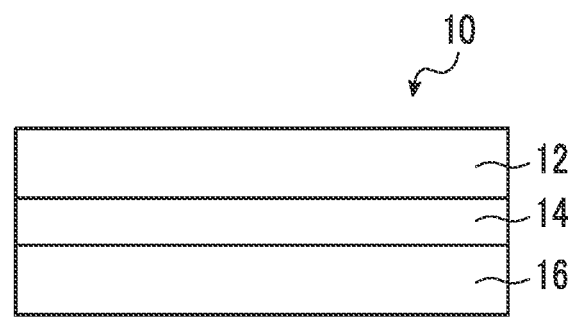
FIG. 1 is a schematic cross-sectional view showing an example of the optical film of an embodiment of the present invention.

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In addition, in the present specification, only one kind of the substance corresponding to each component may be used alone or two or more kinds thereof may also be used in combination, for each component. Here, in a case where the two or more kinds of substances are used in combination for each component, the content of the component refers to a total content of the substances used in combination unless otherwise specified.

In addition, in the present specification, the bonding direction of a divalent group (for example, —CO—NR—) as noted is not particularly limited unless the bonding position is specified, and for example, in a case where $D^1$ in Formula (I) which will be described later is —CO—NR—, $D^1$ may be either *1-CO—NR-*2 or *1-NR—CO-*2, in which *1 represents a bonding position to the $G^1$ side and *2 represents a bonding position to the $Ar^1$ side.

[Optically Anisotropic Layer]

The optically anisotropic layer of an embodiment of the present invention is an optically anisotropic layer obtained by polymerizing a polymerizable liquid crystal composition (hereinafter also formally referred to as a "polymerizable liquid crystal composition of the embodiment of the present invention") containing a polymerizable liquid crystal compound.

In addition, in the optically anisotropic layer of the embodiment of the present invention, in a case where an amplitude value at each wavelength determined by subjecting data of a three-dimensional surface roughness to a Fourier transform is defined as L, the amplitude value L at a wavelength of 5.0 μm or more is 0.125 or more, and the amplitude value L at a wavelength of 2.0 to 2.5 μm is 0.025 or less.

In the present invention, the amplitude value L at each wavelength means a value calculated by the following procedure.

(1) Measurement

A rough shape in an area in 128 μm×128 μm on a surface of the optically anisotropic layer is measured using a surface shape measurement system [VertScan (registered trademark) R5500G, manufactured by Hitachi High-Tech Science Corporation] under the following conditions, and the image data are read.

Measurement mode: Phase mode
Complementation: Conducted
Baseline correction: Conducted
Objective lens magnification: 10 times (2) Conversion The obtained image data are subjected to a fast Fourier transform (FFT), and a concentric amplitude distribution in a case where a frequency F is set every 100 (1/mm) with the frequency F being defined as 1/wavelength, is determined. At this time, since the wavelength is 5.0 μm, 1/wavelength=1/5.0 (1/μm)=1,000/5 (1/mm)=200 (1/mm) is obtained, an amplitude value at F≤200 corresponds to the amplitude value L at a wavelength of 5.0 μm or more. Similarly, an amplitude value at 400≤F≤500 corresponds to the amplitude value L at a wavelength of 2.0 to 2.5 μm.

(3) Average

The measurements are performed twice and an average value of the amplitude values obtained each time is calculated.

In the present invention, the occurrence of a haze is suppressed and the winding aptitude is improved by using an optically anisotropic layer in which in a case where an amplitude value at each wavelength determined by subjecting data of a three-dimensional surface roughness to a Fourier transform is defined as L, the amplitude value L at a wavelength of 5.0 μm or more is 0.125 or more, and the amplitude value L at a wavelength of 2.0 to 2.5 μm is 0.025 or less.

A reason therefor is not specifically clear, but is presumed to be as follows by the present inventors.

First, it is considered that a periodic rough shape is formed on a surface of the optically anisotropic layer due to volume shrinkage upon polymerization of the polymerizable liquid crystal composition.

Then, with regard to the formed rough shape, from the results of Comparative Examples 1 to 3 which will be described later, it can be seen that in a case where the amplitude value L at a wavelength of 2.0 to 2.5 μm is larger than 0.025, a haze occurs. In addition, from the results of Comparative Examples 4 to 6 which will be described later, it can be seen that in a case where the amplitude value L at a wavelength of 5.0 μm or more is less than 0.125, the winding aptitude is deteriorated.

In contrast, from the results of Examples 1 to 7 in which the ratio of the number of atoms of the polymerizable liquid crystal compound and the monofunctional compound, the curing temperature, the polymerization initiator, and the like were adjusted, it can be seen that in a case where the amplitude value L at a wavelength of 5.0 μm or more is 0.125 or more and the amplitude value L at a wavelength of 2.0 to 2.5 μm is 0.025 or less, the occurrence of a haze is suppressed and the winding aptitude is improved.

From the above findings, it is considered that in the present invention, a rough shape which does not cause the occurrence of a haze and imparts excellent winding aptitude is formed due to the volume shrinkage upon polymerization of the polymerizable liquid crystal composition.

In the present invention, the amplitude value L at a wavelength of 5.0 μm or more is preferably 0.235 or more, and more preferably from 0.235 to 0.600 for a reason that the winding aptitude is further improved.

In addition, in the present invention, the amplitude value L at a wavelength of 2.0 to 2.5 μm is preferably 0.021 or less, and more preferably from 0.001 to 0.021 for a reason that the occurrence of a haze is further suppressed.

In the present invention, an optically anisotropic layer in which the polymerizable liquid crystal composition of the embodiment of the present invention is immobilized in a liquid crystal state of a smectic phase is preferable for a reason that the contrast of an image display device having the optically anisotropic layer is improved.

Hereinafter, the respective components of the polymerizable liquid crystal composition of the present invention will be described in detail.

[Polymerizable Liquid Crystal Compound]

The polymerizable liquid crystal compound contained in the polymerizable liquid crystal composition of the present invention is not particularly limited as long as it is a liquid crystal compound having a polymerizable group, and is preferably a liquid crystal compound having two or more polymerizable groups.

The polymerizable group contained in the polymerizable liquid crystal compound is not particularly limited, but is preferably a polymerizable group which is radically polymerizable or cationically polymerizable.

A known radically polymerizable group can be used as the radically polymerizable group, and suitable examples thereof include an acryloyloxy group or a methacryloyloxy group. In this case, it is known that the acryloyloxy group generally has a high polymerization rate, and from the viewpoint of improvement of productivity, the acryloyloxy group is preferable but the methacryloyloxy group can also be used as the polymerizable group.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is suitable, and an epoxy group, an oxetanyl group, or the vinyloxy group is particularly preferable.

Particularly preferred examples of the polymerizable groups include a polymerizable group represented by any of Formulae (P-1) to (P-20).

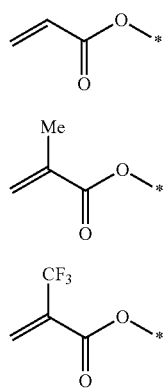

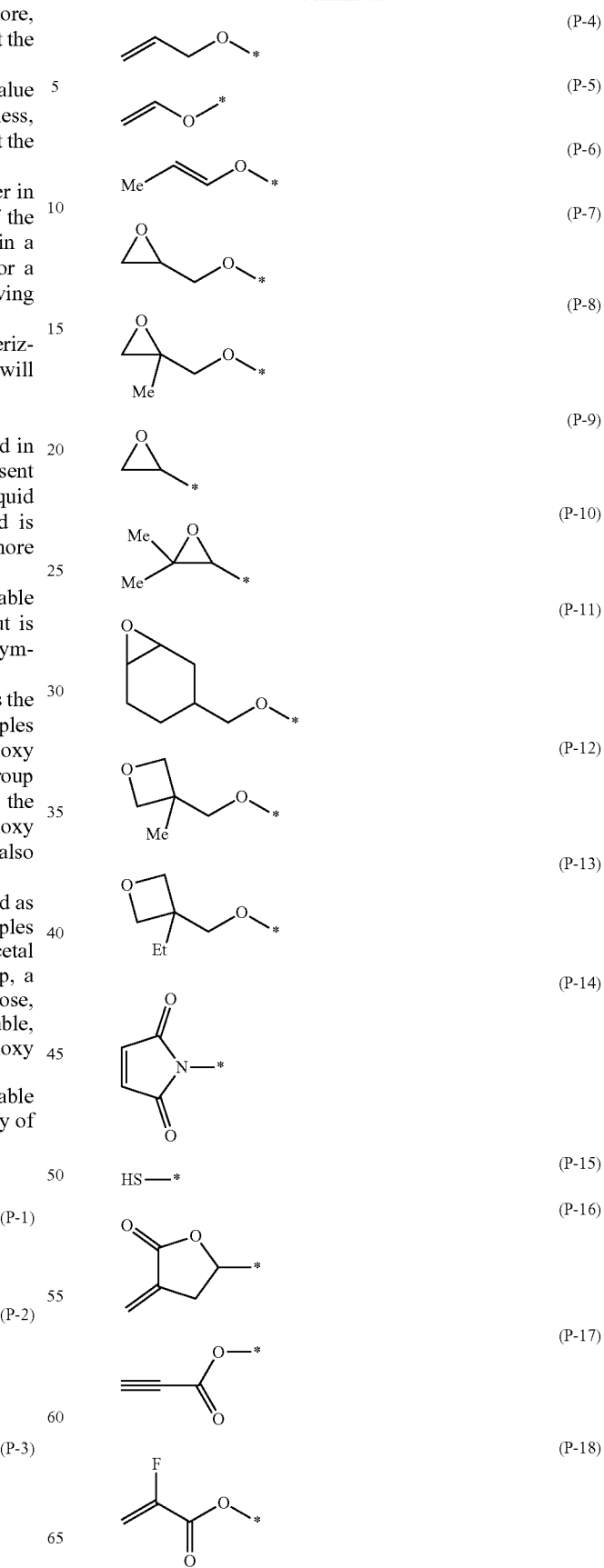

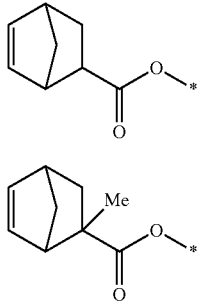

(P-19)

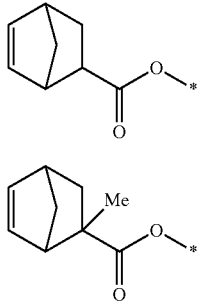

(P-20)

Here, the liquid crystal compounds can be generally classified into a rod-shaped type and a disk-shaped type according to the shape thereof. Furthermore, each liquid crystal compound may be either of a low-molecular-weight type or of a high-molecular-weight type. The term, high-molecular-weight, generally refers to having a degree of polymerization of 100 or more (Polymer Physics-Phase Transition Dynamics, by Masao Doi, page 2, published by Iwanami Shoten, Publishers, 1992).

In the present invention, any of the liquid crystal compounds can be used, but the rod-shaped liquid crystal compound or the discotic liquid crystal compound (disk-shaped liquid crystal compound) is preferably used. Two or more kinds of the rod-shaped liquid crystal compounds, two or more kinds of the disk-shaped liquid crystal compounds, or a mixture of the rod-shaped liquid crystal compound and the disk-shaped liquid crystal compound may be used.

As the rod-shaped liquid crystal compound, for example, the rod-shaped liquid crystal compounds described in claim 1 of JP1999-513019A (JP-H11-513019A) or paragraphs [0026] to [0098] of JP2005-289980A can be preferably used, and as the discotic liquid crystal compound, for example, the discotic liquid crystal compounds described in paragraphs [0020] to [0067] of JP2007-108732A and paragraphs [0013] to [0108] of JP2010-244038A can be preferably used, but the rod-shaped liquid crystal compound is not limited thereto.

In the present invention, the polymerizable liquid crystal compound is preferably a polymerizable liquid crystal compound having reverse wavelength dispersibility (hereinafter also simply referred to as a "reverse dispersion liquid crystal compound") for a reason that the optical compensation property is improved.

Here, in the present specification, the "polymerizable liquid crystal compound having reverse wavelength dispersibility" means that in a case where an in-plane retardation (Re) value at a specific wavelength (visible light range) of a phase difference film manufactured using the polymerizable liquid crystal compound is measured, the Re value is equal or higher as a measurement wavelength is increased.

Examples of the reverse dispersion liquid crystal compound include a compound represented by Formula (I).

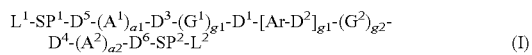

In Formula (I), a1, a2, g1, and g2 each independently represent 0 or 1. It should be noted that at least one of a1 or g1 represents 1, and at least one of a2 or g2 represents 1.

In addition, in Formula (I), q1 represents 1 or 2.

Moreover, in Formula (I), $D^1$, $D^2$, $D^3$, $D^4$, $D^5$, and $D^6$ each independently represent a single bond; —CO—, —O—, —S—, —C(=S)—, —$CR^1R^2$—, —$CR^3$=$CR^4$—, —$NR^5$—, or a divalent linking group consisting of a combination of two or more of these groups, and $R^1$ to $R^5$ each independently represent a hydrogen atom, a fluorine atom, or an alkyl group having 1 to 12 carbon atoms. It should be noted that in a case where q1 is 2, a plurality of $D^2$'s may be the same as or different from each other.

In addition, in Formula (I), $G^1$ and $G^2$ each independently represent an aromatic ring having 6 to 20 carbon atoms, which may have a substituent, or a divalent alicyclic hydrocarbon group having 5 to 20 carbon atoms, which may have a substituent, and one or more of —$CH_2$—'s constituting the alicyclic hydrocarbon group may be substituted with —O—, —S—, or —NH—.

In addition, in Formula (I), $A^1$ and $A^2$ each independently represent an aromatic ring having 6 to 20 carbon atoms, which may have a substituent, or a divalent alicyclic hydrocarbon group having 5 to 20 carbon atoms, which may have a substituent, and one or more of —$CH_2$—'s constituting the alicyclic hydrocarbon group may be substituted with —O—, —S—, or —NH—.

Furthermore, in Formula (I), $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, where Q represents a substituent.

In addition, in Formula (I), $L^1$ and $L^2$ each independently represent a monovalent organic group, and at least one of $L^1$ or $L^2$ represents a polymerizable group. It should be noted that in a case where Ar is an aromatic ring represented by Formula (Ar-3) which will be described later, at least one of $L^1$ or $L^2$, or L or $L^1$ in Formula (Ar-3) represents a polymerizable group.

In Formula (I), it is preferable that any of a1, a2, g1, and g2 is 1 for a reason that the polymerizable liquid crystal composition of the present invention is more likely to exhibit a liquid crystal state of a smectic phase.

In addition, it is preferable that both of a1 and a2 are 0 and both of g1 and g2 are 1 for a reason that the contrast of an image display device having the optically anisotropic layer is improved.

In Formula (I), q1 is preferably 1.

In Formula (I), examples of the divalent linking group represented by one aspect of $D^1$, $D^2$, $D^3$, $D^4$, $D^5$, and $D^6$ include —CO—, —O—, —CO—O—, —C(=S)O—, —$CR^1R^2$—, —$CR^1R^2$—$CR^1R^2$—, —O—$CR^1R^2$—, —$CR^1R^2$—O—$CR^1R^2$—, —CO—O—$CR^1R^2$—, —O—CO—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among these, any of —CO—, —O—, and —CO—O— is preferable.

In Formula (I), examples of the aromatic ring having 6 to 20 carbon atoms, represented by one aspect of $G^1$ and $G^2$, include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring. Among those, the benzene ring (for example, a 1,4-phenyl group) is preferable.

In Formula (I), the divalent alicyclic hydrocarbon group having 5 to 20 carbon atoms, represented by one aspect of $G^1$ and $G^2$, is preferably a 5- or 6-membered ring. In addition, the alicyclic hydrocarbon group may be saturated or unsaturated, but is preferably a saturated alicyclic hydrocarbon group. With regard to the divalent alicyclic hydrocarbon group represented by each of $G^1$ and $G^2$, reference can be made to, for example, the description in paragraph [0078] of JP2012-21068A, the contents of which are hereby incorporated by reference.

In the present invention, $G^1$ and $G^2$ in Formula (I) are each preferably a cycloalkane ring for a reason that the contrast of an image display device having the optically anisotropic layer is improved.

Specific examples of the cycloalkane ring include a cyclohexane ring, a cyclopeptane ring, a cyclooctane ring, a cyclododecane ring, and a cyclodocosane ring.

Among those, the cyclohexane ring is preferable, a 1,4-cyclohexylene group is more preferable, and a trans-1,4-cyclohexylene group is still more preferable.

In addition, in $G^1$ and $G^2$ in Formula (I), examples of a substituent which may be contained in the aromatic ring having 6 to 20 carbon atoms or the divalent alicyclic hydrocarbon group having 5 to 20 carbon atoms include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-alkylcarbamate group, and among these, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and among these, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group exemplified above, and among these, the alkylcarbonyloxy group is preferably a methylcarbonyloxy group, an ethylcarbonyloxy group, an n-propylcarbonyloxy group, or an isopropylcarbonyloxy group, and more preferably the methylcarbonyloxy group.

Examples of the halogen atom include a fluorine atom, a chlorine atom, a bromine atom, and an iodine atom, and among these, the fluorine atom or the chlorine atom is preferable.

In Formula (I), examples of the aromatic ring having 6 to 20 or more carbon atoms, represented by one aspect of $A^1$ and $A^2$, include the same ones as those described in $G^1$ and $G^2$ in Formula (I).

In addition, in Formula (I), examples of the divalent alicyclic hydrocarbon group having 5 to 20 carbon atoms, represented by one aspect of $A^1$ and $A^2$, include the same ones as those described in $G^1$ and $G^2$ in Formula (I).

Moreover, in $A^1$ and $A^2$, examples of the substituent which may be contained in the aromatic ring having 6 to 20 carbon atoms or the divalent alicyclic hydrocarbon group having 5 to 20 carbon atoms include the same ones as the substituents which may be contained in each of $G^1$ and $G^2$ in Formula (I).

Suitable examples of the linear or branched alkylene group having 1 to 12 carbon atoms, represented by one aspect of $SP^1$ and $SP^2$, in Formula (I) include a methylene group, an ethylene group, a propylene group, a butylene group, a pentylene group, a hexylene group, a methylhexylene group, and a heptylene group. Furthermore, $SP^1$ and $SP^2$ may be a divalent linking group in which one or more of —$CH_2$—'s constituting the linear or branched alkylene group having 1 to 12 carbon atoms are substituted with —O—, —S—, —NH—, —N(Q)-, or —CO—, and examples of the substituent represented by Q include the same ones as the substituents which may be contained in each of $G^1$ and $G^2$ in Formula (I).

In Formula (I), examples of the monovalent organic group represented by each of $L^1$ and $L^2$ include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatom constituting the heteroaryl group is preferably a nitrogen atom, a sulfur atom, or an oxygen atom. The number of carbon atoms of the heteroaryl group is preferably 6 to 18, and more preferably 6 to 12. In addition, the alkyl group, the aryl group, and the heteroaryl group may be unsubstituted or have a substituent. Examples of the substituent include the same ones as the substituents which may be contained in each of $G^1$ and $G^2$ in Formula (I).

In Formula (I), examples of the polymerizable group represented by at least one of $L^1$ or $L^2$ include the same ones as the above-mentioned polymerizable groups which are radically polymerizable or cationically polymerizable, and among these, suitable examples of the polymerizable group include the above-mentioned polymerizable group represented by any of Formulae (P-1) to (P-20).

In Formula (I), for a reason that the durability of the optically anisotropic layer is improved, any of $L^1$ and $L^2$ in Formula (I) is preferably a polymerizable group, and more preferably an acryloyloxy group or a methacryloyloxy group.

On the other hand, in Formula (I), Ar represents any of aromatic rings selected from the group consisting of groups represented by Formulae (Ar-1) to (Ar-7). It should be noted that in a case where q1 is 2, a plurality of Ar's may be the same as or different from each other. Furthermore, in Formulae (Ar-1) to (Ar-7), * represents a bonding position to $D^1$ or $D^2$ in Formula (I).

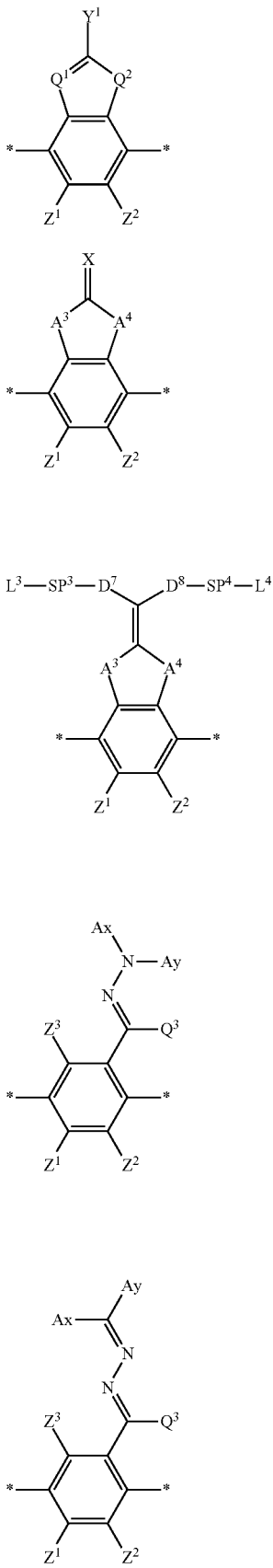

(Ar-1)
(Ar-2)
(Ar-3)
(Ar-4)
(Ar-5)
(Ar-6)
(Ar-7)

In Formula (Ar-1), $Q^1$ represents N or CH, $Q^2$ represents —S—, —O—, or —N($R^6$)—, $R^6$ represents a hydrogen atom or an alkyl group having 1 to 6 carbon atoms, and $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$—'s constituting the alicyclic hydrocarbon group may be substituted with —O—, —S—, or —NH—.

Specific examples of the alkyl group having 1 to 6 carbon atoms, represented by $R^1$, include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms, represented by $Y^1$, include aryl groups such as a phenyl group, a 2,6-diethylphenyl group, and a naphthyl group.

Examples of the aromatic heterocyclic group having 3 to 12 carbon atoms, represented by $Y^1$, include heteroaryl groups such as a thienyl group, a thiazolyl group, a furyl group, and a pyridyl group.

Examples of the alicyclic hydrocarbon group having 6 to 20 carbon atoms, represented by $Y^1$, include a cyclohexylene group, a cyclopentylene group, a norbornene group, and an adamantylene group.

In addition, examples of the substituent which may be contained in $Y^1$ include the same ones as the substituents which may be contained in each of $G^1$ and $G^2$ in Formula (I).

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —$OR^1$, —$NR^8R^9$, —$SR^{10}$, —$COOR^{11}$, or —$COR^{12}$, where $R^7$ to $R^{12}$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, and specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Specific examples of the monovalent aromatic heterocyclic group having 6 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms, represented by each of $R^1$ to $R^{10}$, include a methyl group, an ethyl group, a propyl group, an isopropyl group, an n-butyl group, an isobutyl group, a sec-butyl group, a tert-butyl group, an n-pentyl group, and an n-hexyl group.

As described above, $Z^1$ and $Z^2$ may be bonded to each other to form an aromatic ring, and examples of the structure in a case where $Z^1$ and $Z^2$ in Formula (Ar-1) are bonded to each other form an aromatic ring include a group represented by Formula (Ar-1a). Furthermore, in Formula (Ar-1a), * represents a bonding position to $D^1$ or $D^2$ in Formula (I).

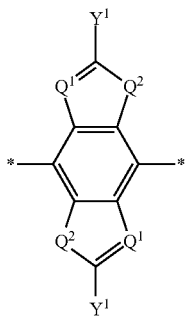

(Ar-1a)

Here, in Formula (Ar-1a), examples of $Q^1$, $Q^2$, and $Y^1$ include the same ones as those described in Formula (Ar-1).

In addition, in Formulae (Ar-2) and (Ar-3), $A^3$ and $A^4$ each independently represent a group selected from the group consisting of —O—, —N($R^{13}$)—, —S—, and —CO—, and $R^{13}$ represents a hydrogen atom or a substituent.

Examples of the substituent represented by $R^{13}$ include the same ones as the substituents which may be contained in each of $G^1$ and $G^2$ in Formula (I).

In addition, in Formula (Ar-2), X represents a hydrogen atom or a non-metal atom of Groups XIV to XVI, to which a substituent may be bonded.

Furthermore, examples of the non-metal atom of Groups 14 to 16 represented by X include an oxygen atom, a sulfur atom, a nitrogen atom to which a hydrogen atom or a substituent is bonded [=N—$R^{N1}$, $R^{N1}$ represents a hydrogen atom or a substituent], and a carbon atom to which a hydrogen atom or a substituent is bonded [=C—($R^{C1}$)$_2$, $R^{C1}$ represents a hydrogen atom or a substituent].

Examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $D^7$ and $D^8$ each independently represent a single bond; or —CO—, —O—, —S—, —C(=S)—, —CR$^1$R$^2$—, —CR$^3$—CR$^4$—, —NR$^5$—, or a divalent linking group consisting of a combination of two or more of these groups, where $R^1$ to $R^5$ each independently represent a hydrogen atom, a fluorine atom, or an alkyl group having 1 to 12 carbon atoms.

Here, specific examples of the divalent linking group include the same ones as those described in $D^1$, $D^2$, $D^3$, $D^4$, $D^5$, and $D^6$ in Formula (I).

Moreover, in Formula (Ar-3), SP$^3$ and SP$^4$ each independently represent a single bond, a linear or branched alkylene group having 1 to 12 carbon atoms, or a divalent linking group in which one or more of —CH$_2$—'s constituting the linear or branched alkylene group having 1 to 12 carbon atoms are substituted with —O—, —S—, —NH—, —N(Q)-, or —CO—, where Q represents a substituent. Examples of the substituent include the same ones as the substituents which may be contained in each of $G^1$ and $G^2$ in Formula (I).

Here, examples of the alkylene group include the same ones as those described in SP$^1$ and SP$^2$ in Formula (I).

Furthermore, in Formula (Ar-3), $L^3$ and $L^4$ each independently represent a monovalent organic group, and at least one of $L^3$ or $L^4$, or $L^1$ or $L^2$ in Formula (I) represents a polymerizable group.

Examples of the monovalent organic group include the same ones as those described in $L^1$ and $L^2$ in Formula (I).

In addition, examples of the polymerizable group include the same ones as the above-mentioned polymerizable groups which are radically polymerizable or cationically polymerizable, and among these, suitable examples thereof include the above-mentioned polymerizable groups represented by any of Formulae (P-1) to (P-20).

Moreover, in Formulae (Ar-4) to (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of each of Ax and Ay include the ones described in paragraphs [0039] to of WO2014/010325A.

Incidentally, specific examples of the alkyl group having 1 to 20 carbon atoms, represented by $Q^3$, include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in each of $G^1$ and $G^2$ in Formula (I).

Examples of the compound represented by Formula (I) include the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (1) described in JP2016-081035A (in particular, the compounds described in paragraph Nos. [0043] to [0055]).

Moreover, suitable examples of the compound represented by Formula (I) include compounds represented by Formulae (1) to (22), and specific examples thereof include the compounds having side chain structures shown in Tables 1 to 3 below as K (side chain structure) in Formulae (1) to (22).

Furthermore, in Tables 1 to 3 below, "*" shown in the side chain structure of K represents a bonding position to an aromatic ring.

In addition, in the side chain structures shown in 2-2 in Table 2 below and 3-2 in Table 3 below, a group adjacent to each of the acryloyloxy group and the methacryloyl group represents a propylene group (a group in which a methyl group is substituted with an ethylene group), and represents a mixture of regioisomers in which the positions of the methyl groups are different.

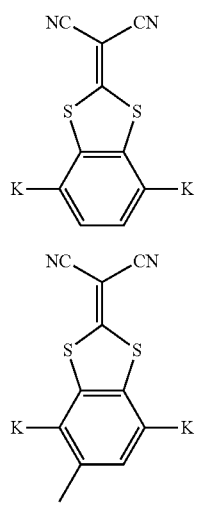

(1)

(2)

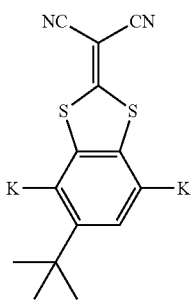

(3)

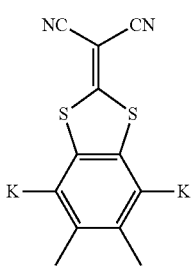

(4)

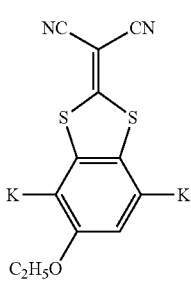

(5)

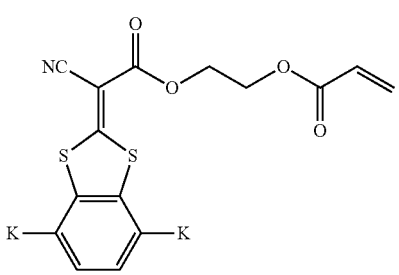

(6)

(7)

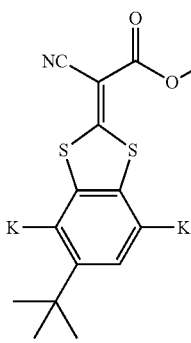

-continued
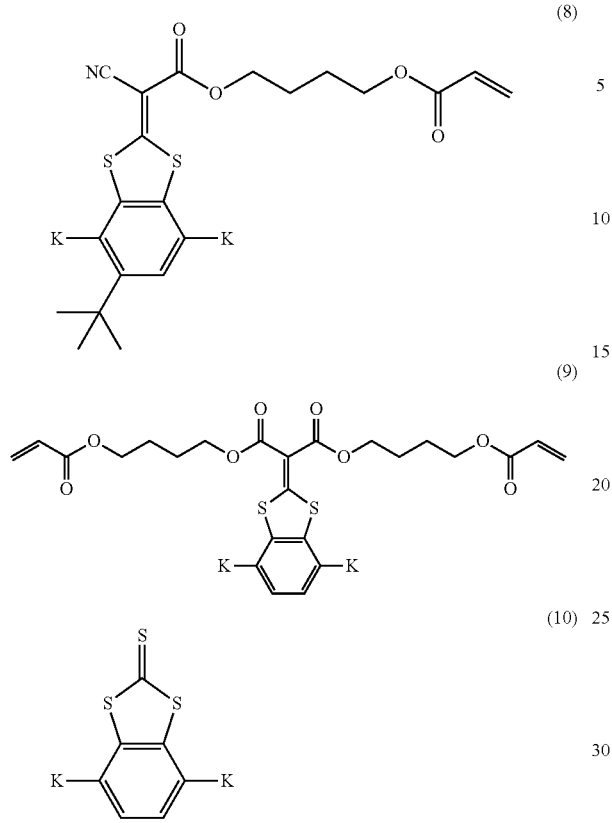
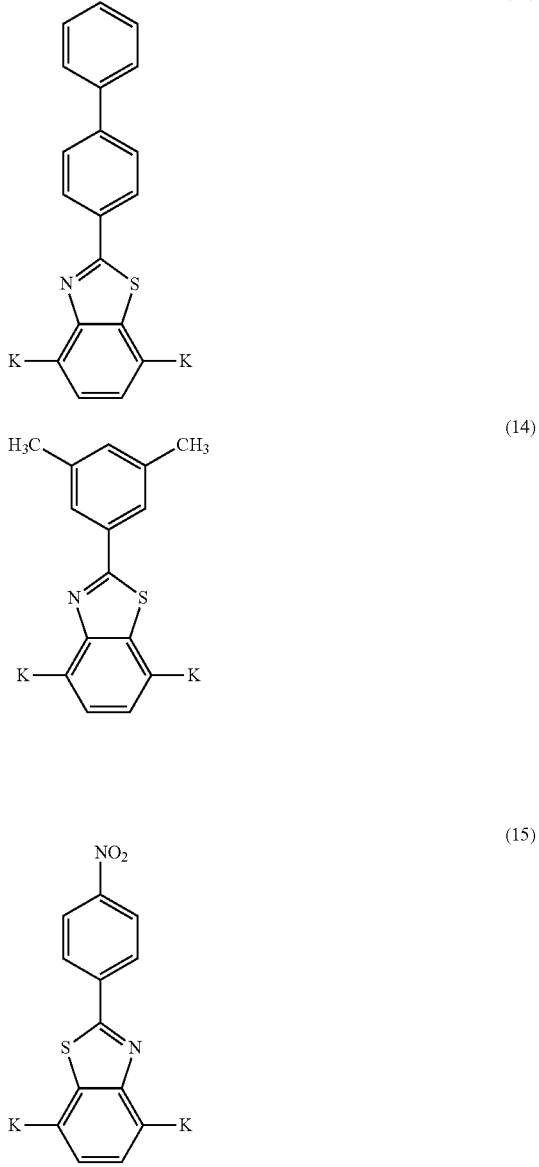
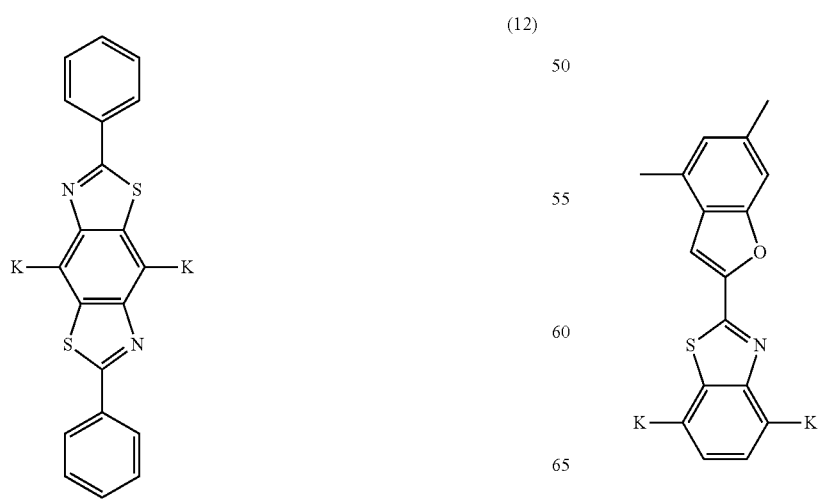

-continued
(17)
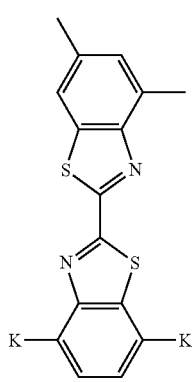
(18)
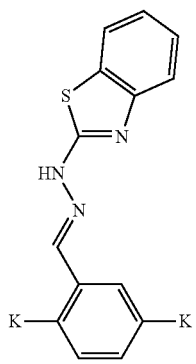
(19)
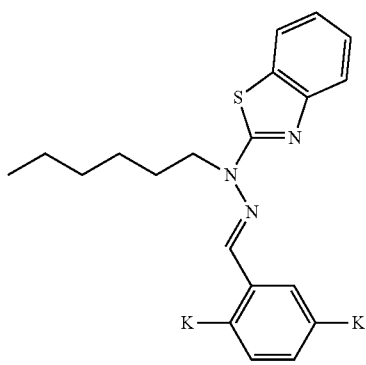
(20)
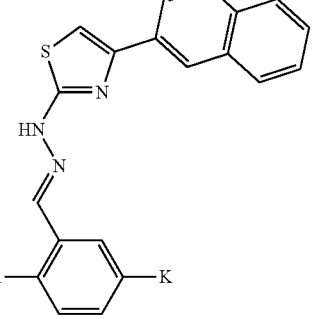
(21)
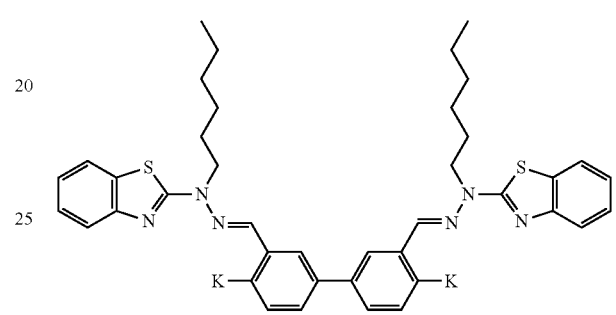
(22)
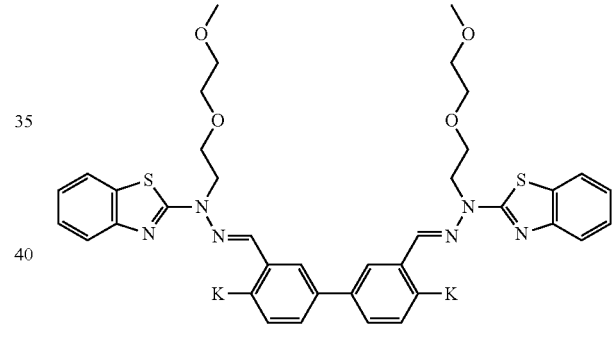
TABLE 1
| K (side chain structure) |
| --- |
| 1-1 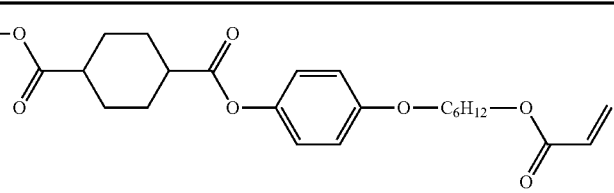 |
| 1-2 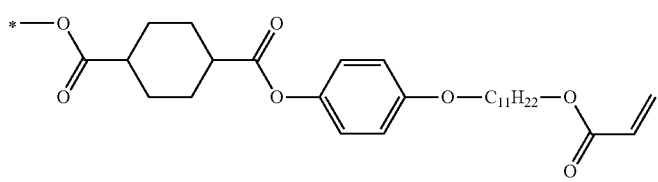 |

TABLE 1-continued

| K (side chain structure) |
| --- |
| 1-3 (structure) |
| 1-4 (structure) |
| 1-5 (structure) |
| 1-6 (structure) |

TABLE 2

| K (side chain structure) |
| --- |
| 2-1 (structure) |
| 2-2 (structure) |
| 2-3 (structure) |
| 2-4 (structure) |
| 2-5 (structure) |
| 2-6 (structure) |

TABLE 2-continued

| K (side chain structure) |
|---|
| 2-7 |
| 2-8 |
| 2-9 |
| 2-10 |
| 2-11 |
| 2-12 |
| 2-13 |
| 2-14 |

TABLE 3

| K (side chain structure) |
|---|
| 3-1 |
| 3-2 |

TABLE 3-continued

| K (side chain structure) |
|---|
| 3-3 |
| 3-4 |
| 3-5 |
| 3-6 |
| 3-7 |
| 3-8 |
| 3-9 |
| 3-10 |
| 3-11 |
| 3-12 |

TABLE 3-continued

K (side chain structure)

3-13

![3-13 structure]

3-14

![3-14 structure]

In the present invention, it is preferable that the polymerizable liquid crystal compound is a compound exhibiting a liquid crystal state of a smectic phase for a reason that the contrast of an image display device having the optically anisotropic layer is improved.

[Monofunctional Compound]

For a reason that the occurrence of a haze in an optically anisotropic layer is further suppressed and the contrast of an image display device having the optically anisotropic layer is improved, it is preferable that the polymerizable liquid crystal composition of the present invention contains a monofunctional compound having one polymerizable group and having two or more ring structures of at least one selected from the group consisting of an aromatic ring and an alicyclic ring.

Here, examples of the polymerizable group contained in the monofunctional compound include the same ones as the polymerizable groups which are radically polymerizable or cationically polymerizable, described in the above-mentioned polymerizable liquid crystal compound, and among these, suitable examples thereof include the polymerizable group represented by any of Formulae (P-1) to (P-20) mentioned above.

In addition, examples of the aromatic ring among the two or more ring structures contained in the monofunctional compound include an aromatic ring having 6 to 20 carbon atoms, which may have a substituent, and specifically include aromatic hydrocarbon rings such as a benzene ring, a naphthalene ring, an anthracene ring, and a phenanthroline ring; and aromatic heterocyclic rings such as a furan ring, a thiophene ring, a pyrrole ring, an oxazole ring, an isoxazole ring, an oxadiazole ring, a thiazole ring, an isothiazole ring, a thiadiazole ring, an imidazole ring, a pyrazole ring, a triazole ring, a furazan ring, a tetrazole ring, a pyridine ring, a pyridazine ring, a pyrimidine ring, a pyrazine ring, a triazine ring, a tetrazine ring, and a benzothiazole ring, and the benzene ring is preferable.

In addition, examples of the alicyclic ring include a cycloalkane ring which may have a substituent, and specifically include a cyclohexane ring, a cyclopeptane ring, a cyclooctane ring, a cyclododecane ring, and a cyclodocosane ring, and among these, the cyclohexane ring is preferable.

Incidentally, examples of the substituent include the same ones as the substituents which may be contained in each of $G^1$ and $G^2$ in Formula (I) in the above-mentioned polymerizable liquid crystal compound.

In the present invention, for a reason that the occurrence of a haze in an optically anisotropic layer is further suppressed and the contrast of an image display device having the optically anisotropic layer is further improved, it is preferable that the monofunctional compound is a compound having a polymerizable group and an aromatic ring which may have a substituent, in which the polymerizable group constitutes one terminal of a molecule, and the aromatic ring or a substituent which may be contained in the aromatic ring constitutes the other terminal of the molecule.

Here, the one terminal and the other terminal refer to a starting atom and an ending atom, respectively, for which a maximum number of atoms is calculated in a case where the atoms on the bond of the compound are linked at the shortest distance, and hydrogen atoms are not included.

In addition, an expression that the polymerizable group constitutes a terminal means that the polymerizable group includes an atom at the terminal, an expression that the aromatic ring constitutes a terminal means that the aromatic ring includes an atom at the terminal, and an expression that the substituent constitutes a terminal means that the substituent contains an atom at the terminal.

In the present invention, for a reason that the surface condition of an optically anisotropic layer is improved, it is preferable that the monofunctional compound is a compound represented by Formula (II).

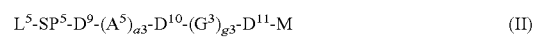

$$L^5\text{-SP}^5\text{-D}^9\text{-}(A^5)_{a3}\text{-D}^{10}\text{-}(G^3)_{g3}\text{-D}^{11}\text{-M} \qquad (II)$$

In Formula (II), a3 and g3 each independently represent an integer of 0 to 2. It should be noted that a3 and g3 represent integers of 1 to 3 in total.

In addition, in Formula (II), $D^9$, $D^{10}$, and $D^{11}$ each independently represent a single bond; or —CO—, —O—, —S—, —C(=S)—, —CR$^1$R$^2$—, —CR$^3$=CR$^4$—, —NR—, or a divalent linking group consisting of a combination of two or more of these groups, where $R^1$ to $R^5$ each independently represent a hydrogen atom, a fluorine atom, or an alkyl group having 1 to 12 carbon atoms.

In addition, in Formula (II), $G^3$ represents an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—. It should be noted that in a case where g3 is 2, a plurality of $G^3$'s may be the same as or different from each other.

In addition, in Formula (II), $A^5$ represents an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—. It should be noted that in a case where a3 is 2, a plurality of $A^5$'s may be the same as or different from each other.

In addition, in Formula (H), $SP^5$ represents a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, where Q represents a substituent.

Furthermore, in Formula (H), $L^5$ represents a polymerizable group.

Incidentally, in Formula (II), M represents an aromatic ring which may have a substituent.

In Formula (II), it is preferable that any of a3 and g3 are 1 for a reason that the polymerizable liquid crystal composition of the present invention is more likely to exhibit a liquid crystal state of a smectic phase.

In Formula (II), examples of the divalent linking group represented by one aspect of $D^9$, $D^{10}$, and $D^{11}$ include the same ones as those exemplified as the divalent linking group represented by one aspect of $D^1$ and the like in Formula (I), and among these, any of —CO—, —O—, and —CO—O— is preferable.

In Formula (II), examples of the aromatic ring having 6 to 20 carbon atoms, represented by one aspect of $G^3$, include the same ones of those exemplified as the aromatic ring having 6 to 20 carbon atoms, represented by one aspect of $G^1$ and the like in Formula (I), and among these, a benzene ring (for example, a 1,4-phenyl group) is preferable.

In Formula (II), examples of the divalent alicyclic hydrocarbon group having 5 to 20 carbon atoms, represented by one aspect of $G^3$, include the same ones as those exemplified as the divalent alicyclic hydrocarbon group having 5 to 20 carbon atoms, represented by one aspect of $G^1$ and the like in Formula (I), and among these, a cycloalkane ring is preferable, a cyclohexane ring is more preferable, a 1,4-cyclohexylene group is still more preferable, and a trans-1,4-cyclohexylene group is particularly preferable.

Moreover, in $G^3$ in Formula (II), examples of the substituent which may be contained in the aromatic ring having 6 to 20 carbon atoms or the divalent alicyclic hydrocarbon group having 5 to 20 carbon atoms include the same ones as the substituents which may be contained in each of $G^1$ and $G^2$ in Formula (I) described in the above-mentioned polymerizable liquid crystal compound.

In Formula (II), examples of the aromatic ring having 6 to 20 or more carbon atoms, represented by one aspect of $A^5$, include the same ones as those described in $G^1$ and $G^2$ in Formula (I).

In addition, in Formula (II), examples of the divalent alicyclic hydrocarbon group having 5 to 20 carbon atoms, represented by one aspect of $A^5$, include the same ones as those described in $G^1$ and $G^2$ in Formula (I).

Moreover, in $A^5$, examples of the substituent which may be contained in the aromatic ring having 6 to 20 carbon atoms or the divalent alicyclic hydrocarbon group having 5 to 20 carbon atoms include the same ones as the substituents which may be contained in each of $G^1$ and $G^2$ in Formula (I) described in the above-mentioned polymerizable liquid crystal compound.

In Formula (II), examples of the linear or branched alkylene group having 1 to 12 carbon atoms, represented by one aspect of $SP^5$, include the same ones as those exemplified as the linear or branched alkylene group having 1 to 12 carbon atoms, represented by one aspect of $SP^1$ and the like in Formula (I).

In Formula (II), examples of the polymerizable group represented by $L^5$ include the same ones as the polymerizable groups which are radically polymerizable or cationically polymerizable, described in the above-mentioned polymerizable liquid crystal compound, and among these, suitable examples thereof include the polymerizable group represented by any of Formulae (P-1) to (P-20).

In Formula (II), examples of the aromatic ring represented by M include an aromatic ring having 6 to 20 carbon atoms, and specifically include the same ones as those exemplified as the aromatic ring having 6 to 20 carbon atoms, represented by one aspect of $G^1$ and the like in Formula (I), and among these, a benzene ring (for example, a 1,4-phenyl group) is preferable.

Incidentally, in M, examples of the substituent which may be contained in the aromatic ring include the same ones as the substituents which may be contained in each of $G^1$ and $G^2$ in Formula (I) described in the above-mentioned polymerizable liquid crystal compound.

Specific examples of the compound represented by Formula (I) include compounds represented by Formulae (TN-1) to (TN-21)

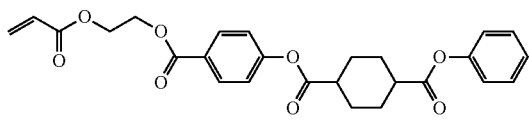

(TN-1)

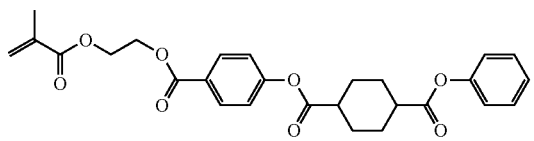

(TN-2)

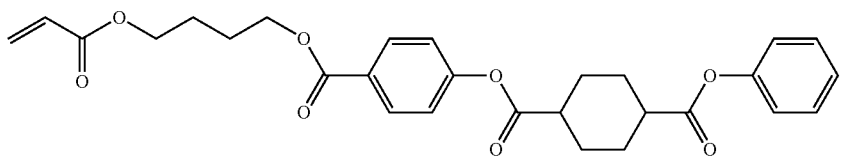

(TN-3)

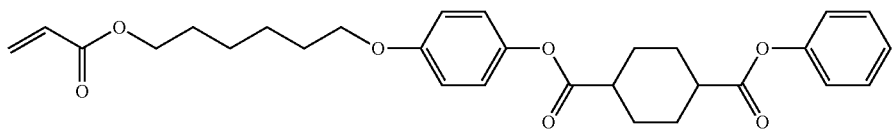

(TN-4)

-continued (TN-5)
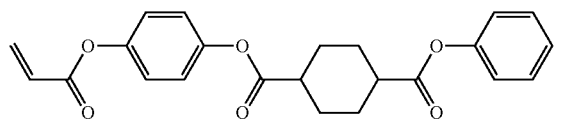

(TN-6)
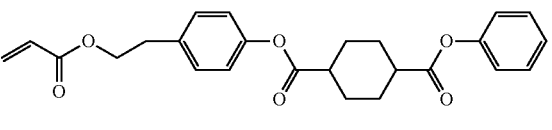

(TN-7)
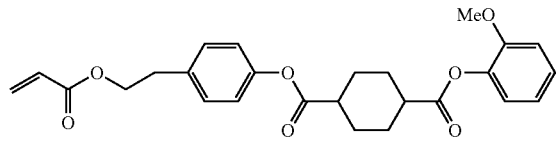

(TN-8)
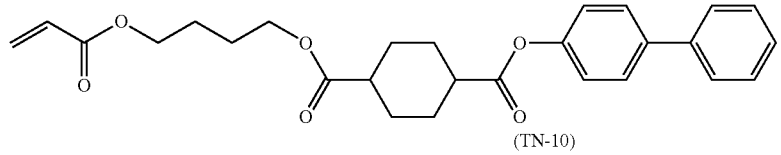

(TN-9)
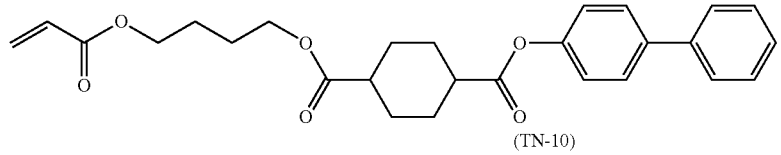

(TN-10)
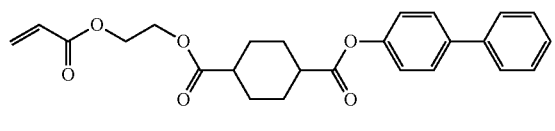

(TN-11)
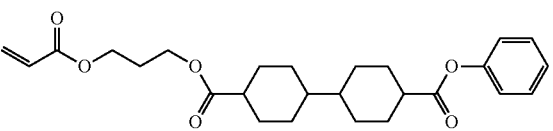

(TN-12)
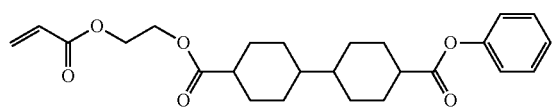

(TN-13)
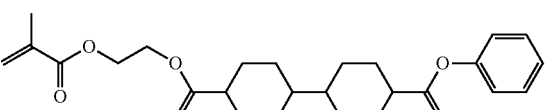

(TN-14)
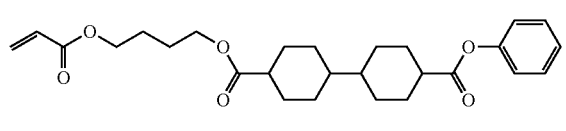

(TN-15)
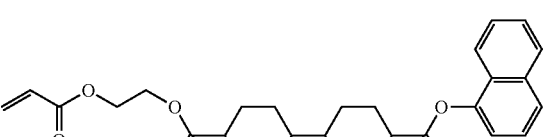

(TN-16)
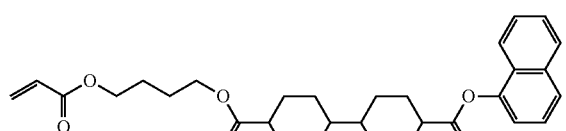

(TN-17)
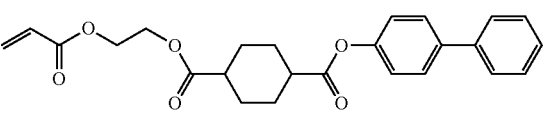

(TN-18)
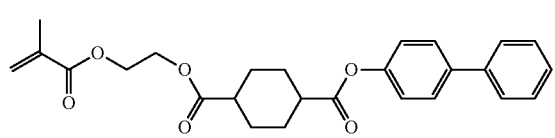

(TN-19)
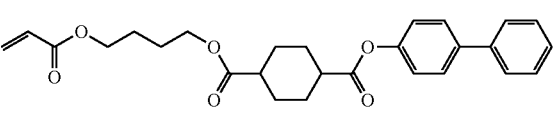

(TN-20)
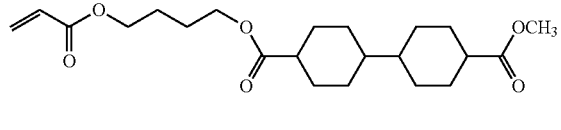

(TN-21)
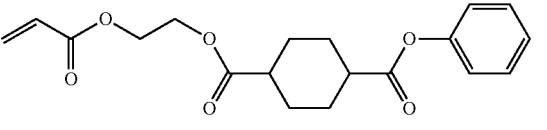

In the present invention, from the viewpoint of accomplishing both the alignment properties of the above-mentioned polymerizable liquid crystal compound and the crosslinkability with the above-mentioned polymerizable liquid crystal compound, a content of a monofunctional compound in a case where the monofunctional compound is contained is preferably 4 to 20 parts by mass, and more preferably 8 to 16 parts by mass with respect to 100 parts by mass of the above-mentioned polymerizable liquid crystal compound.

In addition, in the present invention, the number D1 of atoms of the above-mentioned polymerizable liquid crystal compound and the number D2 of atoms of the above-mentioned monofunctional compound preferably satisfy a relationship of Expression (1), and more preferably satisfy a relationship of Expression (2) for a reason that the occurrence of a haze in an optically anisotropic layer is further suppressed and the winding aptitude is further improved.

$$0.35 \le D2/D1 \le 0.45 \quad (1)$$

$$0.35 < D2/D1 < 0.45 \quad (2)$$

Here, the number of atoms represents the number of atoms on a bond that links one terminal and the other terminal of the compound at the shortest distance, and hydrogen atoms are not included.

In addition, the one terminal and the other terminal refer to a starting atom and an ending atom, respectively, for which a maximum number of atoms is calculated in a case where the atoms on a bond of the compound are linked at the shortest distance, and hydrogen atoms are not included.

[Polymerization Initiator]

The polymerizable liquid crystal composition of the present invention preferably contains a polymerization initiator.

The polymerization initiator to be used is preferably a photopolymerization initiator capable of initiating a polymerization reaction upon irradiation with ultraviolet rays.

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-40799B (JP-S63-40799B), JP1993-29234B (JP-H05-29234B), JP1998-95788A (JP-H10-95788A), and JP1998-29997A (JP-H10-29997A)).

In addition, in the present invention, it is also preferable that the polymerization initiator is an oxime-type polymerization initiator, and specific examples of the polymerization initiator include the initiators described in paragraphs [0049] to [0052] of WO2017/170443A.

[Solvent]

It is preferable that the polymerizable liquid crystal composition of the present invention contains a solvent from the viewpoints of the workability for forming an optically anisotropic layer of the embodiment of the present invention, and the like.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

[Leveling Agent]

It is preferable that the polymerizable liquid crystal composition of the present invention contains a leveling agent from the viewpoint that a surface of the optically anisotropic layer of the embodiment of the present invention is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Specific examples of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). In addition, the leveling agent may also function as an alignment control agent which will be described later.

[Alignment Control Agent]

The polymerizable liquid crystal composition of the present invention can contain an alignment control agent, as desired.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent or a high-molecular-weight alignment control agent can be used.

With regard to the low-molecular-weight alignment control agent, reference can be made to the description in, for example, paragraphs [0009] to [0083] of JP2002-20363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Furthermore, examples of the alignment control agent that forms or accelerates the homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are hereby incorporated by reference.

On the other hand, the cholesteric alignment can be achieved by adding a chiral agent to the polymerizable liquid crystal composition of the embodiment of the present invention, and it is possible to control the direction of revolution of the cholesteric alignment by its chiral direction.

Incidentally, it is possible to control the pitch of the cholesteric alignment in accordance with the alignment regulating force of the chiral agent.

In a case where an alignment control agent is contained, a content thereof is preferably 0.01% to 10% by mass, and more preferably 0.05% to 5% by mass with respect to the mass of the total solid content of the composition. In a case where the content is within the range, it is possible to obtain a cured product which has no precipitation or phase separation, alignment defects, or the like, and is uniform and highly transparent while achieving a desired alignment state.

[Other Components]

The polymerizable liquid crystal composition of the embodiment of the present invention may contain components other than the above-mentioned components, and examples of such other components include a surfactant, a tilt angle control agent, an alignment assistant, a plasticizer, and a crosslinking agent.

The optically anisotropic layer of the embodiment of the present invention is a cured product obtained by polymerizing the above-mentioned polymerizable liquid crystal composition of the embodiment of the present invention. In addition, the cured product can be formed on any of supports in the optical film of the embodiment of the present invention, which will be described later or a polarizer in the polarizing plate of an embodiment of the present invention, which will be described later.

Examples of a method for forming the cured product include a method in which the above-mentioned polymerizable liquid crystal composition of the embodiment of the present invention is used to cause a desired alignment state, and then immobilized by polymerization.

Here, the polymerization conditions are not particularly limited, but in the polymerization by irradiation with light, ultraviolet rays are preferably used. The irradiation dose is preferably 10 mJ/cm² to 50 J/cm², more preferably 20 mJ/cm² to 5 J/cm², still more preferably 30 mJ/cm² to 3 J/cm², and particularly preferably 50 mJ/cm² to 1,000 mJ/cm². In addition, the polymerization may be carried out under a heating condition in order to accelerate the polymerization reaction.

In the present invention, in a case where the above-mentioned polymerizable liquid crystal composition of the present invention is a composition exhibiting a liquid crystal state of a smectic phase, it is preferable to perform polymerization at a temperature at which a difference between a phase transition temperature (N—Sm transition temperature) from a nematic phase to a smectic phase and a temperature upon UV irradiation (curing temperature) is lower than 20° C.

The optically anisotropic layer of the embodiment of the present invention is preferably an optically anisotropic layer satisfying Expression (I).

$$0.50 < Re(450)/Re(550) < 1.00 \quad \text{(III)}$$

Here, in Expression (III), Re(450) represents an in-plane retardation at a wavelength of 450 nm of the optically anisotropic layer, and Re(550) represents an in-plane retardation at a wavelength of 550 nm of the optically anisotropic layer. In addition, in the present specification, in a case where the measurement wavelength of the retardation is not specified, the measurement wavelength is 550 mu.

Furthermore, the values of the in-plane retardation and the thickness-direction retardation refer to values measured with light at the measurement wavelength using AxoScan OPMF-1 (manufactured by Opto Science, Inc.).

Specifically, by inputting the average refractive index $((Nx+Ny+Nz)/3)$ and the film thickness (d (μm)) to AxoScan OPMF-1, it is possible to calculate:

Slow axis direction (°)

$$Re(\lambda) = R0(\lambda)$$

$$Rth(\lambda) = ((nx + ny)/2 - nz) \times d.$$

In addition, $R0(\lambda)$ is expressed in a numerical value calculated with AxoScan OPMF-1, but means $Re(\lambda)$.

In addition, such an optically anisotropic layer is preferably a positive A plate or a positive C plate, and more preferably the positive A plate.

Here, the positive A plate (A plate which is positive) and the positive C plate (C plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A plate satisfies the relationship of Expression (A1) and the positive C plate satisfies the relationship of Expression (C1). In addition, the positive A plate has an Rth showing a positive value and the positive C plate has an Rth showing a negative value.

$$nx > ny \approx nz \quad \text{Expression (A1)}$$

$$nz > nx \approx ny \quad \text{Expression (C1)}$$

Furthermore, the symbol, "≈", encompasses not only a case where the both sides are completely the same as each other but also a case where the both are substantially the same as each other.

The expression, "substantially the same", means that with regard to the positive A plate, for example, a case where $(ny-nz) \times d$ (in which d is the thickness of a film) is −10 to 10 nm, and preferably −5 to 5 nm is also included in "ny≈nz", and a case where $(nx-nz) \times d$ is −10 to 10 nm, and preferably −5 to 5 nm is also included in "nx≈nz". In addition, with regard to the positive C plate, for example, a case where $(nx-ny) \times d$ (in which d is the thickness of a film) is 0 to 10 nm, and preferably 0 to 5 nm is also included in "nx≈ny".

In a case where the optically anisotropic layer is a positive A plate, the Re(550) is preferably 100 to 180 nm, more preferably 120 to 160 nm, still more preferably 130 to 150 nm, and particularly preferably 130 to 140 nm, from the viewpoint that the optically anisotropic layer functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized light).

[Optical Film]

The optical film of an embodiment of the present invention is an optical film having the optically anisotropic layer of the embodiment of the present invention.

FIG. 1 is a schematic cross-sectional view showing an example of the optical film of an embodiment of the present invention.

Furthermore, FIG. 1 is a schematic view, and the thicknesses relationship, the positional relationship, and the like among the respective layers are not necessarily consistent with actual ones, and any of the support shown in FIG. 1 and an alignment film are optional constitutional members.

An optical film 10 shown in FIG. 1 has a support 16, an alignment film 14, and an optically anisotropic layer 12 as the cured product in this order.

In addition, the optically anisotropic layer 12 may be a laminate of two or more different optically anisotropic layers. For example, in a case where the polarizing plate of an embodiment of the present invention which will be described later is used as a circularly polarizing plate or in a case where the optical film of an embodiment of the present invention is used as an optical compensation film for an IPS mode or an FFS mode liquid crystal display device, the optically anisotropic layer 12 is preferably a laminate of a positive A plate and a positive C plate.

In addition, the optically anisotropic layer may be peeled from the support, and the optically anisotropic layer may be used alone as an optical film.

Hereinafter, various members used for the optical film of the embodiment of the present invention will be described in detail.

[Optically Anisotropic Layer]

An optically anisotropic layer included in the optical film of the embodiment of the present invention is the above-mentioned optically anisotropic layer of the embodiment of the present invention.

In the optical film of the embodiment of the present invention, a thickness of the optically anisotropic layer is not particularly limited, but is preferably 0.1 to 10 μm, and more preferably 0.5 to 5 μm.

[Support]

The optical film of the embodiment of the present invention may have a support as a base material for forming an optically anisotropic layer as mentioned above.

Such a support is preferably transparent, and specifically, it preferably has a light transmittance of 80% or more.

Examples of such a support include a glass substrate and a polymer film, and examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

In the present invention, a thickness of the support is not particularly limited, but is preferably 5 to 60 μm, and more preferably 5 to 40 μm.

[Alignment Film]

In a case where the optical film of the embodiment of the present invention has any of the above-mentioned supports, it is preferable that the optical film has an alignment film between the support and the optically anisotropic layer. Furthermore, an aspect in which the above-mentioned support may also function as an alignment film is also available.

The alignment film generally has a polymer as a main component. The materials for the polymer material for an alignment film are described in many documents, and many commercially available products can be used.

The polymer material used in the present invention is preferably a polyvinyl alcohol or a polyimide, or a derivative thereof. Particularly, a modified or non-modified polyvinyl alcohol is preferable.

Examples of the alignment film that can be used in the present invention include the alignment films described for Line 24 on Page 43 to Line 8 on Page 49 of WO01/88574A; the modified polyvinyl alcohols described in paragraphs [0071] to [0095] of JP3907735B; and the liquid crystal alignment film formed by a liquid crystal alignment agent described in JP2012-155308A.

In the present invention, for a reason that it is possible to prevent deterioration in the surface condition by avoiding a contact with the surface of an alignment film upon formation of the alignment film, a photo-alignment film is also preferably used as the alignment film.

The photo-alignment film is not particularly limited, but the polymer materials such as a polyamide compound and a polyimide compound, described in paragraphs [0024] to [0043] of WO2005/096041A; the liquid crystal alignment film formed by a liquid crystal alignment agent having a photo-alignment group, described in JP2012-155308A; LPP-JP265CP, trade name, manufactured by Rolic Technologies Ltd.; or the like can be used.

In addition, in the present invention, the thickness of the alignment film is not particularly limited, but from the viewpoint of forming an optically anisotropic layer having a uniform film thickness by mitigating the surface roughness that can be present on the support, the thickness is preferably 0.01 to 10 μm, more preferably 0.01 to 1 μm, and still more preferably 0.01 to 0.5 μm.

[Ultraviolet Absorber]

The optical film of the embodiment of the present invention preferably includes an ultraviolet (UV) absorber, taking an effect of external light (particularly ultraviolet rays) into consideration.

The ultraviolet absorber may be contained in the optically anisotropic layer of the embodiment of the present invention or may also be contained in a member other than an optically anisotropic layer constituting the optical film of the embodiment of the present invention. Suitable examples of the member other than the optically anisotropic layer include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferably used from the viewpoint that it has high ultraviolet absorptivity and ultraviolet absorbing ability (ultraviolet-shielding ability) used for an image display device is obtained.

In addition, in order to broaden ultraviolet absorbing ranges, two or more kinds of ultraviolet absorbers having different maximum absorption wavelengths can be used in combination.

Specific examples of the ultraviolet absorber include the compounds described in paragraphs [0258] and [0259] of JP2012-18395A and the compounds described in paragraphs [0055] to [0105] of JP2007-72163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

[Polarizing Plate]

A polarizing plate of an embodiment of the present invention has the above-mentioned optical film of the embodiment of the present invention and a polarizer.

Furthermore, in a case where the above-mentioned optically anisotropic layer of the embodiment of the present invention is a λ/4 plate (positive A plate), the polarizing plate of the embodiment of the present invention can be used as a circularly polarizing plate.

In a case where the polarizing plate of the embodiment of the present invention is used as a circularly polarizing plate, the above-mentioned optically anisotropic layer of the embodiment of the present invention is used as a λ/4 plate (positive A plate), and an angle formed by the slow axis of the λ/4 plate and the absorption axis of a polarizer which will be described later is preferably 30° to 60°, more preferably 40° to 50°, still more preferably 42° to 48°, and particularly preferably 45°.

In addition, the polarizing plate of the embodiment of the present invention can also be used as an optical compensation film for an IPS mode or FFS mode liquid crystal display device.

In a case where the polarizing plate of the embodiment of the present invention is used as an optical compensation film for an IPS mode or FFS mode liquid crystal display device, it is preferable that the above-mentioned optically anisotropic layer of the embodiment of the present invention is used as at least one plate of a laminate of a positive A plate and a positive C plate, an angle formed by the slow axis of the positive A plate layer and the absorption axis of a polarizer which will be described later are orthogonal or parallel, and specifically, it is more preferable that an angle formed by the slow axis of the positive A plate layer and the absorption axis of the polarizer which will be described later is 0° to 5° or 85° to 95°.

Here, the "slow axis" of the λ/4 plate or the positive A plate layer means a direction in which a refractive index in the plane of the λ/4 plate or the positive A plate layer is maximum, and the "absorption axis" of the polarizer means a direction in which the absorbance is highest.

[Polarizer]

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dyeing in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range, and a ¼ wavelength plate, or the like is used as the reflective type polarizer.

Among those, a polarizer including a polyvinyl alcohol-based resin (a polymer including —$CH_2$—CHOH— as a repeating unit, in particular, at least one selected from the group consisting of a polyvinyl alcohol and an ethylene-vinyl alcohol copolymer) is preferable from the viewpoint that it has more excellent adhesiveness.

In the present invention, the thickness of the polarizer is not particularly limited, but is preferably 3 sum to 60 μm, more preferably 3 μm to 30 μm, and still more preferably 3 μm to 10 μm.

[Pressure Sensitive Adhesive Layer]

The polarizing plate of the embodiment of the present invention may have a pressure sensitive adhesive layer arranged between the optically anisotropic layer in the optical film of the embodiment of the present invention and the polarizer.

The pressure sensitive adhesive layer used for lamination of the cured product and the polarizer represents, for example, a substance in which a ratio (tanδ=G"/G') between a storage elastic modulus G' and a loss elastic modulus G", each measured with a dynamic viscoelastometer, is 0.001 to 1.5, and examples thereof include a so-called pressure sensitive adhesive or a readily creepable substance. Examples of the pressure sensitive adhesive that can be used in the present invention include a polyvinyl alcohol-based pressure sensitive adhesive, but the pressure sensitive adhesive is not limited thereto.

[Adhesive Layer]

The polarizing plate of the embodiment of the present invention may have an adhesive layer arranged between the optically anisotropic layer in the optical film of the embodiment of the present invention and the polarizer.

As the adhesive layer used for laminating a cured product and a polarizer, a curable adhesive composition that is cured by irradiation with active energy rays or heating is preferable.

Examples of the curable adhesive composition include a curable adhesive composition containing a cationically polymerizable compound and a curable adhesive composition containing a radically polymerizable compound.

A thickness of the adhesive layer is preferably 0.01 to 20 μm, more preferably 0.01 to 10 μm, and still more preferably 0.05 to 5 μm. In a case where the thickness of the adhesive layer is within this range, floating or peeling does not occur between the protective layer or optically anisotropic layer and the polarizer, which are laminated, and a practically acceptable adhesive force can be obtained.

[Image Display Device]

An image display device of an embodiment of the present invention is an image display device having the optical film of the embodiment of the present invention or the polarizing plate of the embodiment of the present invention.

A display element used in the image display device of the embodiment of the present invention is not particularly limited, and examples thereof include a liquid crystal cell, an organic electroluminescent (hereinafter simply referred to as "EL") display panel, and a plasma display panel.

Among those, the liquid crystal cell and the organic EL display panel are preferable, and the liquid crystal cell is more preferable. That is, as the image display device of the embodiment of the present invention, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device of the embodiment of the present invention is a liquid crystal display device having the above-mentioned polarizing plate of the embodiment of the present invention and a liquid crystal cell.

In addition, in the present invention, it is preferable that the polarizing plate of the embodiment of the present invention is used as the polarizing plate of the front side, and it is more preferable that the polarizing plate of the embodiment of the present invention is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

The liquid crystal cell used for the liquid crystal display device is preferably in a vertical alignment (VA) mode, an optically compensated bend (OCB) mode, an in-plane-switching (IPS) mode, a fringe-field-switching (FFS) mode, or a twisted nematic (TN) mode, but is not limited thereto.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-shaped liquid crystal molecules are substantially vertically aligned during no voltage application thereto. Examples of the VA-mode liquid crystal cell include (1) a VA-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for viewing angle enlargement (described in SID97, Digest of Tech. Papers (preprint), 28 (1997) 845), (3) a liquid crystal cell in a mode (n-ASM mode) in which rod-shaped liquid crystal molecules are substantially vertically aligned during no voltage application thereto and are twistedly multi-domain aligned during voltage application thereto (described in Seminar of Liquid Crystals of Japan, Papers (preprint), 58-59 (1998)), and (4) a survival-mode liquid crystal cell (announced in LCD International 98). In addition, the liquid crystal cell may be of any of a patterned vertical alignment (PVA) type, an optical alignment type, and a polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP1998-54982A (JP-H10-54982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Suitable examples of the organic EL display device which is an example of the image display device of the embodiment of the present invention include an aspect which includes, from the visible side, a polarizer, a λ/4 plate (a positive A plate) including the optically anisotropic layer of the embodiment of the present invention, and an organic EL display panel in this order.

Furthermore, the organic EL display panel is a display panel composed of an organic EL device in which an organic light emitting layer (organic electroluminescent layer) is sandwiched between electrodes (between a cathode and an anode). The configuration of the organic EL display panel is not particularly limited but a known configuration is adopted.

EXAMPLES

Hereinafter, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention.

Therefore, the scope of the present invention should not be construed as being limited to Examples shown below.

Example 1

[Manufacture of Protective Film 1]

<Preparation of Core Layer Cellulose Acylate Dope 1>

The following composition was put into a mixing tank and stirred to dissolve the respective components to prepare a core layer cellulose acylate dope 1.

| Core layer cellulose acylate dope 1 | |
| --- | --- |
| Cellulose acetate having a degree of acetyl substitution of 2.88 | 100 parts by mass |
| Ester oligomer (the following compound 1-1) | 10 parts by mass |
| Durability improver (the following compound 1-2) | 4 parts by mass |
| Ultraviolet absorber (the following compound 1-3) | 3 parts by mass |
| Methylene chloride (first solvent) | 438 parts by mass |
| Methanol (second solvent) | 65 parts by mass |

Compound 1-1

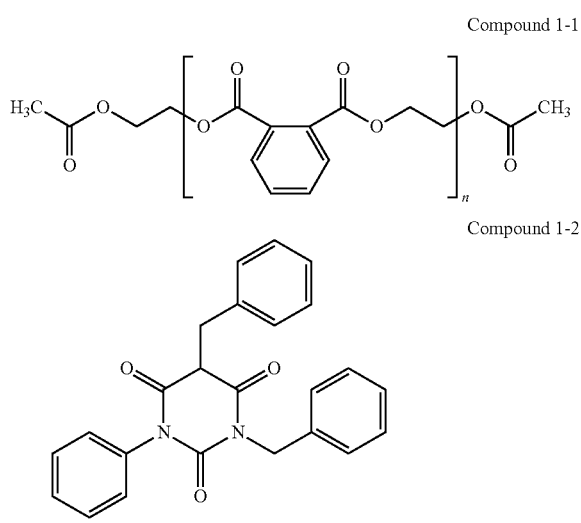

Compound 1-2

-continued

Compound 1-3

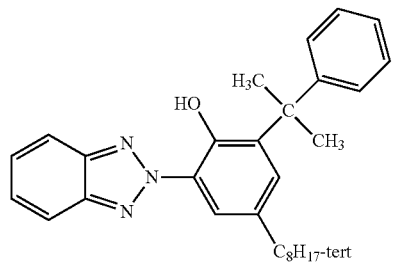

<Preparation of Outer Layer Cellulose Acylate Dope 1>

10 parts by mass of the following matting agent dispersion liquid 1 was added to 90 parts by mass of the core layer cellulose acylate dope 1 to prepare an outer layer cellulose acylate dope 1.

| Matting agent solution | |
|---|---|
| Silica particles with an average particle size of 20 nm (AEROSIL R972, manufactured by NIPPON AEROSIL, CO., LTD.) | 2 parts by mass |
| Methylene chloride (first solvent) | 76 parts by mass |
| Methanol (second solvent) | 11 parts by mass |
| Core layer cellulose acylate dope 1 | 1 part by mass |

<Manufacture of Protective Film 1>

Three layers of the core layer cellulose acylate dope 1 and the outer layer cellulose acylate dopes 1 on both sides thereof were simultaneously casted from a casting port onto a drum at 20° C. In a state where a content of the solvent in the film on the drum was approximately 20% by mass, the film was peeled from the drum, and both ends of the obtained film in the width direction were fixed with tenter clips, and in a state where a content of the residual solvent in the film was 3% to 15% by mass, the film was stretched 1.2 times in the transverse direction and dried. Thereafter, the obtained film was transported between the rolls of a heat treatment device to manufacture a cellulose acylate film 1 with a thickness of 25 µM, which was used as a protective film 1.

[Manufacture of Protective Film 1 with Hardcoat Layer]

As a coating liquid for forming a hardcoat layer, a curable composition (hardcoat layer 1) for a hardcoat layer shown in Table 4 below was prepared.

TABLE 4

| | Monomer | | | | UV initiator | | |
| | | | | | | Addition | |
| | Monomer 1 | Monomer 2 | Monomer 1/monomer 2 | Sum of addition amounts [parts by mass] | Type | amount [parts by mass] | Solvent |
|---|---|---|---|---|---|---|---|
| Hardcoat layer 1 | Pentaerythritol triacrylate | Pentaerythritol tetraacrylate | 3/2 | 53.5 | UV initiator 1 | 1.5 | Ethyl acetate |

The structure of a UV initiator 1 in Table 4 above is shown below.

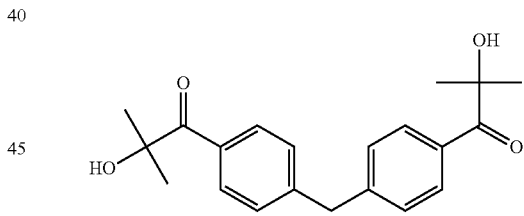

The curable composition 1 for hardcoat layer was applied onto a surface of the protective film 1 manufactured above, then dried at 100° C. for 60 seconds, irradiated with UV at 1.5 kW and 300 mJ under the conditions of 0.1% or less of nitrogen, and cured to manufacture a protective film 1 with a hardcoat layer, having a hardcoat layer with a film thickness of 5 µm. Furthermore, the film thickness of the hardcoat layer was adjusted by adjusting a coating amount by a die coating method, using a slot die.

[Manufacture of Polarizing Plate 1 with Protective Film on One Surface]

(1) Saponification of Film

The manufactured protective film 1 with a hardcoat layer was immersed for 1 minute in a 4.5 mol/L aqueous sodium hydroxide solution (saponified solution) whose temperature was adjusted to 37° C., and then the film was washed with water, then immersed in a 0.05 mol/L aqueous sulfuric acid solution for 30 seconds, and then further passed through a water washing bath. Then, the obtained film was repeatedly dehydrated three times with an air knife, water was dropped thereto, and then the film was dried by leaving it in a drying zone at 70° C. for 15 seconds to manufacture a protective film 1 with a hardcoat layer which had been saponified.

(2) Manufacture of Polarizer

According to Examples of JP2016-148724A, a polarizer with a film thickness of 15 μm was prepared by giving a circumferential speed difference between two pairs of nip rolls and performing stretching in the longitudinal direction. A polarizer thus manufactured was used as a polarizer 1.

(3) Bonding

The polarizer 1 thus obtained and the protective film 1 with a hardcoat layer which had been subjected to a saponification treatment were bonded in a roll-to-roll manner so that the polarizing axis and the longitudinal direction of the film were orthogonal to each other, using a 3% aqueous PVA solution (manufactured by Kuraray Co., Ltd., PVA-117H) as an adhesive, thereby manufacturing a polarizing plate 1 with a protective film on one surface (hereinafter also simply referred to as a "polarizing plate 1"). At this time, the bonding was performed so that the cellulose acylate film side of the protective film was on the polarizer side.

[Manufacture of Polarizing Plate 2 with Protective Film on One Surface]

In the same manner as in the manufacture of the polarizing plate 1, except that a hardcoat layer was not provided on a surface of the protective film 1, a polarizing plate 2 with a protective film on one surface (hereinafter also simply referred to as a "polarizing plate 2") was manufactured. Furthermore, in the following Examples and Comparative Examples, each liquid crystal display device was manufactured, using the polarizing plate 1 on a visible side and the polarizing plate 2 on a backlight side unless otherwise specified.

[Manufacture of Protective Film 2]

<Manufacture of Core Layer Cellulose Acylate Dope 2>

The following composition was put into a mixing tank and stirred to dissolve the respective components to prepare a core layer cellulose acylate dope 2.

| Core layer cellulose acylate dope 2 | |
| --- | --- |
| Cellulose acetate having a degree of acetyl substitution of 2.88 | 100 parts by mass |
| The following polyester | 12 parts by mass |
| The durability improver (the compound 1-2) | 4 parts by mass |
| Methylene chloride (first solvent) | 430 parts by mass |
| Methanol (second solvent) | 64 parts by mass |

Polyester (Number-Average Molecular Weight of 800)

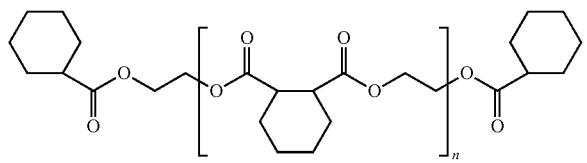

<Manufacture of Outer Layer Cellulose Acylate Dope 2>

10 parts by mass of the following matting agent solution was added to 90 parts by mass of the core layer cellulose acylate dope 2 to prepare an outer layer cellulose acylate dope 2.

| Matting agent solution | |
| --- | --- |
| Silica particles with an average particle size of 20 nm (AEROSIL R972, manufactured by NIPPON AEROSIL CO., LTD.) | 2 parts by mass |
| Methylene chloride (first solvent) | 76 parts by mass |
| Methanol (second solvent) | 11 parts by mass |
| Core layer cellulose acylate dope | 1 part by mass |

<Manufacture of Protective Film 2>

The core layer cellulose acylate dope 2 and the outer layer cellulose acylate dope 2 were filtered through a filter paper having an average pore diameter of 34 μm and a sintered metal filter having an average pore diameter of 10 μm, and then all the three layers of the core layer cellulose acylate dope 2 and the outer layer cellulose acylate dopes 2 on both sides thereof were simultaneously cast on a drum at 20° C. from a casting port (band casting machine).

Subsequently, the film was peeled from the drum in a state where a content of the solvent of the film on the drum reached approximately 20% by mass, the both ends of the film in the width direction were fixed with tenter clips, and the film was dried while being stretched at a stretching ratio of 1.1 times in the transverse direction.

Thereafter, the obtained film was transported between the rolls of a heat treatment device and further dried to manufacture a cellulose acylate film 2 with a thickness of 40 μm, which was used as a protective film 2. As a result of the measurement of the phase difference of the protective film 2, Re=1 nm and Rth=−5 nm were obtained.

[Manufacture of Optically Anisotropic Layer 1]

<Preparation of Composition 1 for Photo-Alignment Film>

The photo-alignment film forming material described in Example 1 of WO2016/002722A was prepared.

<Preparation of Composition for Forming Optically Anisotropic Layer>

A composition for forming an optically anisotropic layer having the following composition was prepared.

| Composition 1 for forming an optically anisotropic layer | |
| --- | --- |
| The following polymerizable liquid crystal compound S1 | 42.00 parts by mass |
| The following polymerizable liquid crystal compound S2 | 42.00 parts by mass |
| The following polyfunctional polymerizable compound R1 | 4.00 parts by mass |
| The following monofunctional compound T1 | 12.00 parts by mass |
| The following polymerization initiator B1 | 0.50 parts by mass |
| The following leveling agent P1 | 0.15 parts by mass |
| HISOLVE MTEM (manufactured by Toho Chemical Industry Co., Ltd.) | 2.00 parts by mass |
| NK ESTER A-200 (manufactured by Shin Nakamura Chemical Co., Ltd.) | 1.00 part by mass |
| Methyl ethyl ketone | 424.8 parts by mass |

Furthermore, a group adjacent to the acryloyloxy group of each of the following polymerizable liquid crystal compounds S1 and S2 represents a propylene group (a group obtained by substituting a methyl group with an ethylene group), and the following polymerizable liquid crystal compounds S1 and S2 each represent a mixture of regioisomers having different positions of the methyl groups.

Polymerizable Liquid Crystal Compound S1 (Number D1 of Atoms: 56)

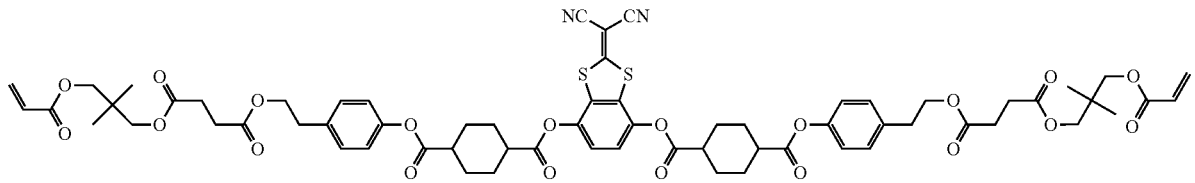 [SMILES: C=CC(=O)OCC(C)(C)COC(=O)CCC(=O)OCCc1ccc(OC(=O)C2CCC(C(=O)Oc3ccc(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Polymerizable Liquid Crystal Compound S2 (Number D1 of Atoms: 56)

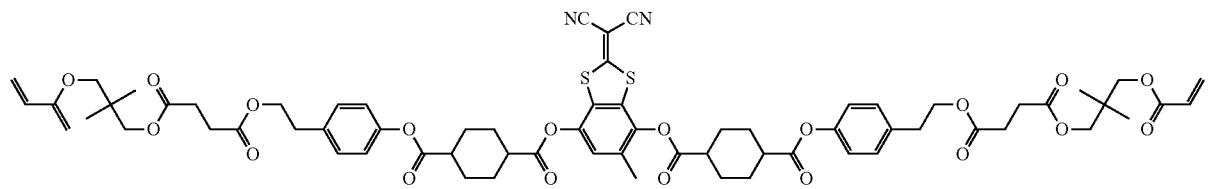 [SMILES: C=CC(=C)OCC(C)(C)COC(=O)CCC(=O)OCCc1ccc(OC(=O)C2CCC(C(=O)Oc3cc(C)c(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Polyfunctional Polymerizable Compound R1

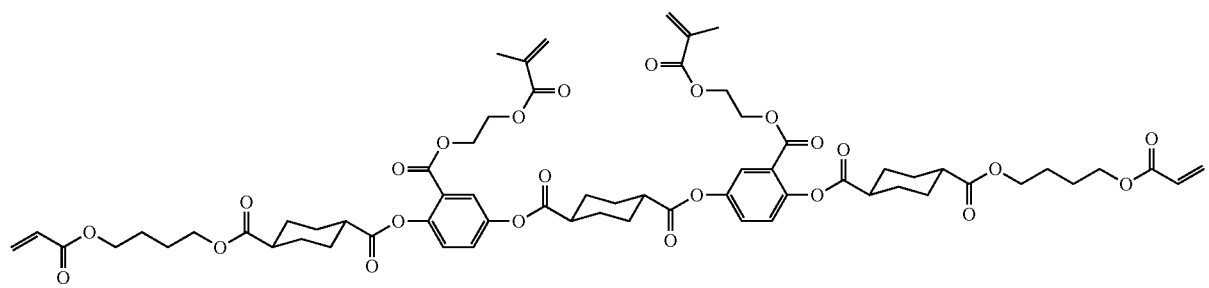 [SMILES: C=CC(=O)OCCCCOC(=O)C1CCC(C(=O)Oc2ccc(OC(=O)C3CCC(C(=O)Oc4ccc(OC(=O)C5CCC(C(=O)OCCCCOC(=O)C=C)CC5)c(C(=O)OCCOC(=O)C(=C)C)c4)CC3)cc2C(=O)OCCOC(=O)C(=C)C)CC1]

Monofunctional Compound T1 (Number D2 of Atoms: 24)

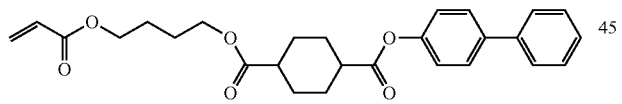

Polymerization Initiator B1

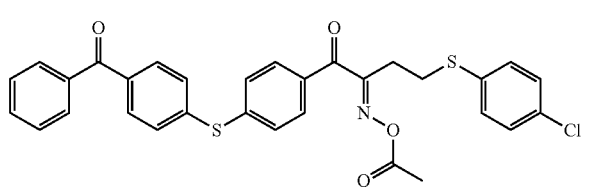 [SMILES: CC(=O)O/N=C(\CCSc1ccc(Cl)cc1)C(=O)c1ccc(Sc2ccc(C(=O)c3ccccc3)cc2)cc1]

Leveling agent P1 (in the following formula, a to c satisfy a:b:c=66:26:8, and represent contents (% by mole) of the respective repeating units with respect to all repeating units in the resin)

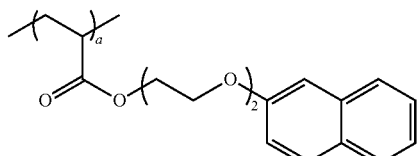
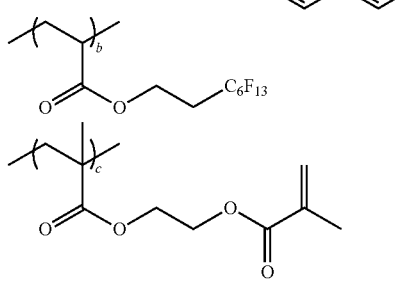

<Manufacture of Optically Anisotropic Layer 1>

The photo-alignment film forming material prepared above was applied onto one surface of the manufactured protective film 2 under the condition of a transport speed of 30 m/min by a die coating method, using the slot die described in Example 1 of JP2006-122889A, and dried at 120° C. for 1 minute to remove the solvent. Thereafter, the film was irradiated with polarized ultraviolet rays (10 mJ/cm², using an ultra-high-pressure mercury lamp), to form a photo-alignment film 1 with a thickness of 0.3 µm.

Subsequently, the composition 1 for forming an optically anisotropic layer prepared above was applied onto the photo-alignment film 1 with a spin coater so that the film thickness after drying was 2.5 µm. After the application, the film was heated for 30 seconds in a temperature range indicating the liquid crystal state of a nematic phase, cooled to a temperature 23° C. lower than a phase transition temperature from the nematic phase to a smectic phase, and then irradiated with UV (300 mJ/cm²) at the temperature to manufacture an optically anisotropic layer 1 immobilized in the liquid crystal state of the smectic phase, and thus, an optical film 1 was obtained.

Examples 2 to 5 and Comparative Examples 1 to 5

An optically anisotropic layer was manufactured by the same method as in Example 1, except for a polymerizable liquid crystal compound, a monofunctional compound, a polymerization initiator, a phase transition temperature (N—Sm transition temperature) from a nematic phase to a smectic phase, and a difference in temperatures during UV irradiation (curing temperature) were changed to those shown in Table 5 below, and thus, an optical film was obtained.

Furthermore, in Comparative Example 4, UV irradiation was performed at a temperature higher than a phase transition temperature from the nematic phase to the smectic phase, specifically at a temperature 10° C. higher than the phase transition temperature, which is different from Examples 1 to 5, and accordingly, ΔT in Table 5 below is noted as −10° C.

Example 6

An optically anisotropic layer was manufactured by the same method as in Example 1, except that the composition 1 for forming an optically anisotropic layer was changed to a composition 2 for forming an optically anisotropic layer having the following composition, and thus, an optical film was obtained.

Furthermore, the structures of the polymerizable liquid crystal compounds having the following compositions are collectively shown after Table 5 below.

| Composition 2 for forming an optically anisotropic layer | |
|---|---|
| The following polymerizable liquid crystal compound S3 | 20.00 parts by mass |
| The following polymerizable liquid crystal compound S4 | 40.00 parts by mass |
| The following polymerizable liquid crystal compound S5 | 40.00 parts by mass |
| The following monofunctional compound T6 | 15.00 parts by mass |
| The polymerization initiator S1 | 0.50 parts by mass |

-continued

| Composition 2 for forming an optically anisotropic layer | |
|---|---|
| The leveling agent P1 | 0.20 parts by mass |
| Cyclopentanone | 424.8 parts by mass |

Example 7

An optically anisotropic layer was manufactured by the same method as in Example 1, except that 84 parts by mass of a polymerizable liquid crystal compound S6 described later was used instead of the polymerizable liquid crystal compound S1 and the polymerizable liquid crystal compound S2, and thus, an optical film was obtained.

Comparative Example 6

An optically anisotropic layer was manufactured by the same method as in Example 1, except that 84 parts by mass of a polymerizable liquid crystal compound N1 described later was used instead of the polymerizable liquid crystal compound S1 and the polymerizable liquid crystal compound S2, and LV irradiation was performed in a nematic phase liquid crystal state, and thus, an optical film was obtained.

Furthermore, in Comparative Example 6, UV irradiation was performed in the liquid crystal state of the nematic phase as mentioned above, and accordingly, ΔT in Table 5 below is noted as "-".

[Evaluation]

<Haze>

With regard to the manufactured optical film, a haze H represented by the following expression was measured using a turbidimeter "NDH-1001DP" manufactured by Nippon Denshoku Industries Co., Ltd., based on the measurement method specified by JIS-K7361-1, and evaluated according to the following evaluation standard. The results are shown in Table 5 below.

$$\text{Haze } H = (\text{Diffused light}/\text{Whole transmitted light}) \times 100(\%)$$

(Evaluation Standard)
  A: 1.0% or less
  B: More than 1.0% and less than 2.0%
  C: More than 2.0%

<Winding Aptitude>

In accordance with the methods described in Examples 1 to 7 and Comparative Examples 1 to 6, an optical film in a form of a film roll having a winding length of 2,600 m was manufactured in a plastic-made winding core having a winding core diameter of 16.9 cm with a winding tension of 30 kg and a winding end of 20 kg.

The manufactured film roll was stored for one month, the black band state was observed, and the film roll was evaluated in accordance with the following evaluation standard. The results are shown in Table 5 below.

(Evaluation Standard)
  AA: No black band-shaped failure is seen
  A: Black band-shaped failure is seen, but occurs in a region of 10% or less of the total width
  B: Black band-shaped failure is seen, but it occurs in an area wider than 10% of the total width.

TABLE 5

| | Optically anisotropic layer | | Polymerizable liquid crystal compound | | Monofunctional compound | | | | Performance | | |
|---|---|---|---|---|---|---|---|---|---|---|---|
| | Amplitude value L at wavelength of 5.0 μm or more | Amplitude value L at wavelength of 2.0 to 2.5 μm | Liquid crystal phase | Type | Number D1 of atoms | Type | Number D2 of atoms | Ratio D2/D1 | Polymer- ization initiator | ΔT* (° C.) | Haze | Winding aptitude |
| Example 1 | 0.235 | 0.005 | Smectic | S1<br>S2 | 56<br>56 | T1 | 24 | 0.43<br>0.43 | B1 | 23 | 0.21<br>A | AA |
| Example 2 | 0.531 | 0.011 | Smectic | S1<br>S2 | 56<br>56 | T2 | 22 | 0.39<br>0.39 | B1 | 23 | 0.42<br>A | AA |
| Example 3 | 0.597 | 0.017 | Smectic | S1<br>S2 | 56<br>56 | T3 | 20 | 0.36<br>0.36 | B1 | 23 | 0.75<br>A | AA |
| Example 4 | 0.146 | 0.005 | Smectic | S1<br>S2 | 56<br>56 | T4 | 27 | 0.48<br>0.48 | B1 | 23 | 0.22<br>A | A |
| Example 5 | 0.195 | 0.021 | Smectic | S1<br>S2 | 56<br>56 | T5 | 18 | 0.32<br>0.32 | B1 | 12 | 0.82<br>A | A |
| Example 6 | 0.184 | 0.010 | Smectic | S3<br>S4<br>S5 | 44<br>44<br>44 | T6 | 22 | 0.50<br>0.50<br>0.50 | B1 | 23 | 0.34<br>A | A |
| Example 7 | 0.288 | 0.007 | Smectic | S6 | 50 | T2 | 22 | 0.44 | B1 | 23 | 0.26<br>A | AA |
| Comparative Example 1 | 1.355 | 0.029 | Smectic | S1<br>S2 | 56<br>56 | T5 | 18 | 0.32<br>0.32 | B1 | 23 | 2.55<br>C | AA |
| Comparative Example 2 | 0.621 | 0.032 | Smectic | S1<br>S2 | 56<br>56 | T2 | 22 | 0.39<br>0.39 | B2 | 23 | 3.25<br>C | AA |
| Comparative Example 3 | 0.201 | 0.027 | Smectic | S1<br>S2 | 56<br>56 | — | — | — | B1 | 23 | 1.23<br>B | A |
| Comparative Example 4 | 0.021 | 0.003 | Nematic | S1<br>S2 | 56<br>56 | T7 | 26 | 0.46<br>0.46 | B1 | −10 | 0.21<br>A | B |
| Comparative Example 5 | 0.121 | 0.005 | Smectic | S1<br>S2 | 56<br>56 | T7 | 26 | 0.46<br>0.46 | B1 | 23 | 0.22<br>A | B |
| Comparative Example 6 | 0.01 | 0.003 | Nematic | N1 | 34 | — | — | — | B1 | — | 0.07<br>A | C |

The structures of the polymerizable liquid crystal compounds and the like in Table 5 are shown below.

Polymerizable Liquid Crystal Compound S1 (Number D1 of Atoms: 56)

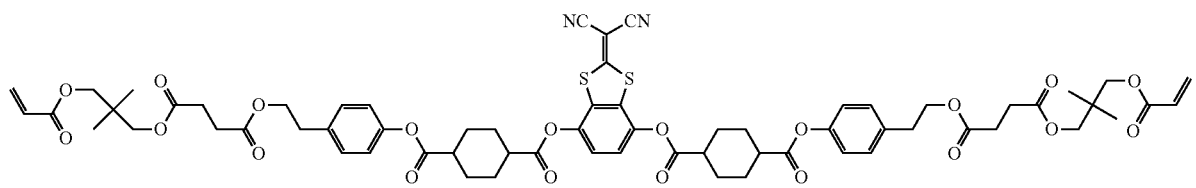 [SMILES: C=CC(=O)OCC(C)(C)COC(=O)CCC(=O)OCCc1ccc(OC(=O)C2CCC(C(=O)Oc3ccc(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Polymerizable Liquid Crystal Compound S2 (Number D1 of Atoms: 56)

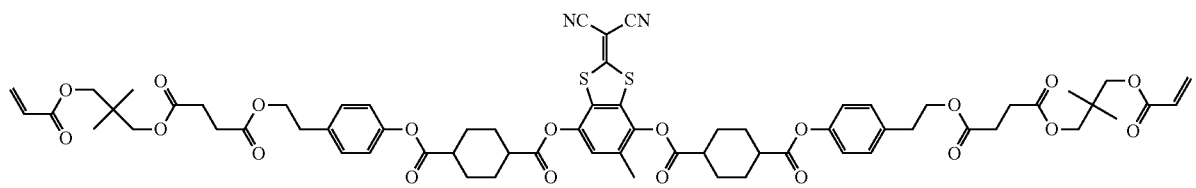 [SMILES: C=CC(=O)OCC(C)(C)COC(=O)CCC(=O)OCCc1ccc(OC(=O)C2CCC(C(=O)Oc3cc(C)c(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Polymerizable Liquid Crystal Compound S3 (Number D1 of Atoms: 44)
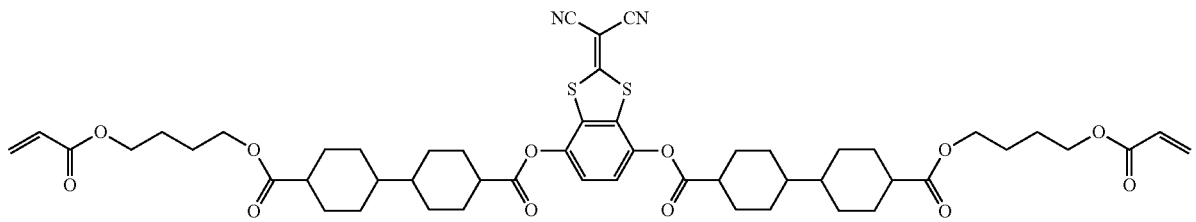 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]
Polymerizable Liquid Crystal Compound S4 (Number D1 of Atoms: 44)
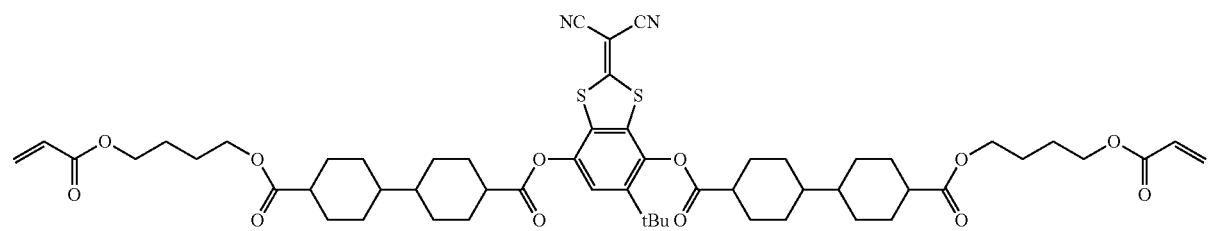 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]
Polymerizable Liquid Crystal Compound S5 (Number D1 of Atoms: 44)
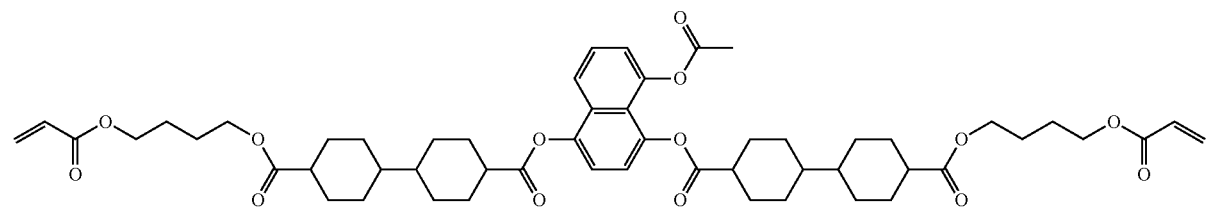 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c(OC(C)=O)cccc34)CC2)CC1]
Polymerizable Liquid Crystal Compound S6 (Number D1 of Atoms: 50)
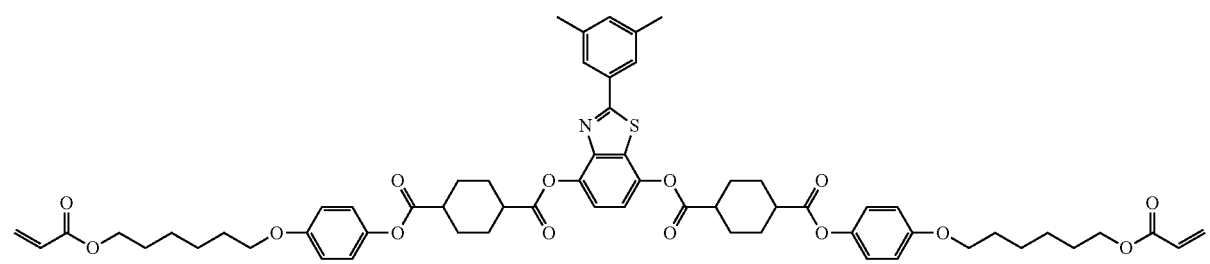 [SMILES: C=CC(=O)OCCCCCCOc1ccc(OC(=O)C2CCC(C(=O)Oc3ccc(OC(=O)C4CCC(C(=O)Oc5ccc(OCCCCCCOC(=O)C=C)cc5)CC4)c4sc(-c5cc(C)cc(C)c5)nc34)CC2)cc1]

Polymerizable Liquid Crystal Compound N1 (Number D1 of Atoms: 34)
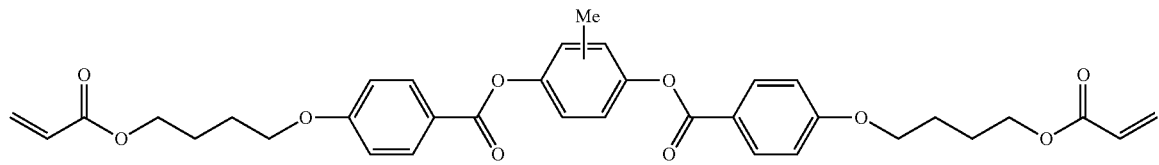
Monofunctional Compound T1 (Number D2 of Atoms: 24)
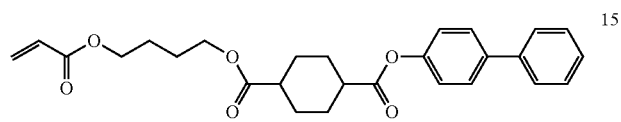
Monofunctional Compound T2 (Number D2 of Atoms: 22)
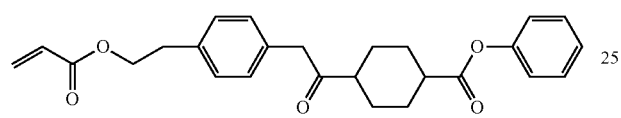
Monofunctional Compound T3 (Number D2 of Atoms: 20)
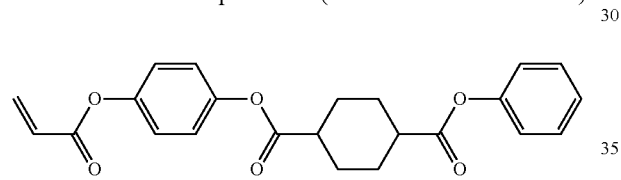
Monofunctional Compound T4 (Number D2 of Atoms: 27)
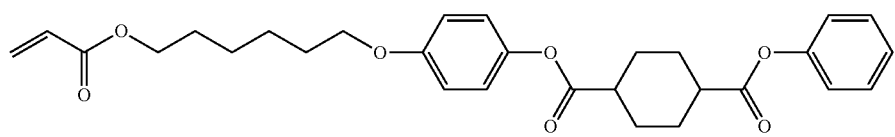 [SMILES: C=CC(=O)OCCCCCCOc1ccc(OC(=O)C2CCC(C(=O)Oc3ccccc3)CC2)cc1]
Monofunctional Compound T5 (Number D2 of Atoms: 18)
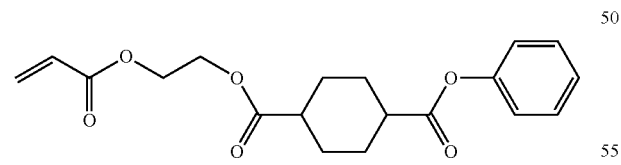
Monofunctional Compound T6 (Number D2 of Atoms: 22)
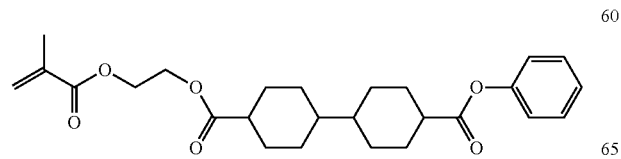

Monofunctional Compound T7 (Number D2 of Atoms: 26)

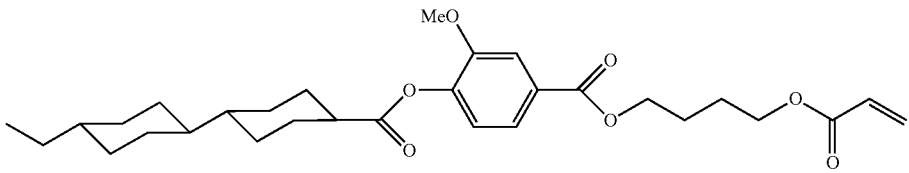 [SMILES: C=CC(=O)OCCCCOC(=O)c1ccc(OC(=O)C2CCC(C3CCC(CC)CC3)CC2)c(OC)c1]

Polymerization Initiator B1

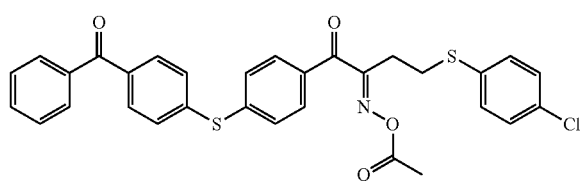 [SMILES: CC(=O)O/N=C(\CCSc1ccc(Cl)cc1)C(=O)c1ccc(Sc2ccc(C(=O)c3ccccc3)cc2)cc1]

Polymerization Initiator B2

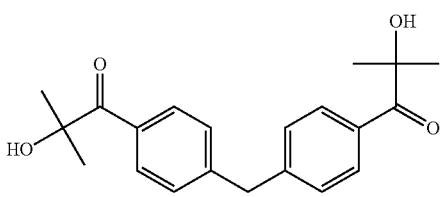 [SMILES: CC(C)(O)C(=O)c1ccc(Cc2ccc(C(=O)C(C)(C)O)cc2)cc1]

From the results shown in Table 5 above, it was found that a haze occurs in a case where the amplitude value L at a wavelength of 2.0 to 2.5 μm is more than 0.025 (Comparative Examples 1 to 3).

In addition, it was found that in a case where the amplitude value L at a wavelength of 5.0 μm or more is less than 0.125, the winding aptitude is deteriorated (Comparative Examples 4 to 6).

In contrast, it was found that in a case where the amplitude value L at a wavelength of 5.0 μm or more is 0.125 or more and the amplitude value L at a wavelength of 2.0 to 2.5 m is 0.025 or less, the occurrence of a haze is suppressed and the winding aptitude is improved (Examples 1 to 7).

Moreover, from the results of Example 2 and Comparative Example 2, it was found that the amplitude value L at a wavelength of 5.0 μm or more and the amplitude value L at a wavelength of 2.0 to 2.5 μm can be adjusted by changing the type of the polymerization initiator.

Furthermore, from the results of Example 5 and Comparative Example 1, it was found that the amplitude value L at a wavelength of 5.0 μm or more and the amplitude value L at a wavelength of 2.0 to 2.5 μm can be adjusted by changing the curing temperature.

In addition, from the results of Examples 1 to 7, it was found that the amplitude value L at a wavelength of 5.0 μm or more and the amplitude value L at a wavelength of 2.0 to 2.5 μm can be adjusted by changing the types of the polymerizable liquid crystal compound and the monofunctional compound, and in particular, in a case where a ratio (D2/D1) of the number D1 of atoms of the polymerizable liquid crystal compound to the number D2 of atoms of the monofunctional compound is from 0.35 to 0.45, the winding aptitude is improved.

EXPLANATION OF REFERENCES

10: optical film
12: optically anisotropic layer
14: alignment film
16: support

What is claimed is:

1. An optically anisotropic layer in which a polymerizable liquid crystal composition is immobilized in a liquid crystal state, the polymerizable liquid crystal composition containing a polymerizable liquid crystal compound,
wherein a surface of the optically anisotropic layer has a periodic rough shape, an amplitude value L due to the periodic rough shape at a wavelength of 5.0 μm or more is 0.125 or more, and the amplitude value L due to the periodic rough shape at a wavelength of 2.0 to 2.5 μm is 0.025 or less,
wherein the polymerizable liquid crystal composition further contains a monofunctional compound having one polymerizable group and having two or more ring structures of at least one selected from the group consisting of an aromatic ring and an alicyclic ring,
wherein the polymerizable liquid crystal composition further contains an oxime ester based polymerization initiator, and
the polymerizable liquid crystal compound is a compound represented by Formula (I)

$$L^1\text{-}SP^1\text{-}D^5\text{-}(A^1)_{a1}\text{-}D^3\text{-}(G^1)_{g1}\text{-}D^1\text{-}[Ar\text{-}D^2]_{q1}\text{-}(G^2)_{g2}\text{-}D^4\text{-}(A^2)_{a2}\text{-}D^6\text{-}SP^2\text{-}L^2 \quad (I)$$

in Formula (I),
a1, a2, g1, and g2 each independently represent 0 or 1, provided that at least one of a1 or g1 represents 1, and at least one of a2 or g2 represents 1,
q1 represents 1 or 2,
$D^1$, $D^2$, $D^3$, $D^4$, $D^5$, and $D^6$ each independently represent a single bond; or —CO—, —O—, —S—, —C(=S)—, —CR$^1$R$^2$—, —CR$^3$=CR$^4$—, —NR$^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where q1 is 2, a plurality of $D^2$'s may be the same as or different from each other,
$G^1$ and $G^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—,
$A^1$ and $A^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—, SP$^1$ and SP$^2$ each independently represent a single bond, a linear alkylene group having 1 to 12 carbon atoms, a branched alkylene group having 3 to 12 carbon atoms, or a divalent linking group in which one or more of —CH$_2$—'s constituting the linear or branched alkylene group are substituted with —O—, —S—, —NH—, —N(Q)-, or —CO—, where Q represents a substituent, L$^1$ and L$^2$ each independently represent a monovalent organic group, and at least one of L$^1$ or L$^2$ represents a polymerizable group, provided that in a case where Ar is an aromatic ring represented by Formula (Ar-3), at least one of L$^1$ or L$^2$, or L$^3$ or L$^4$ in Formula (Ar-3) represents a polymerizable group, and Ar represents any of aromatic rings selected from the group consisting of groups represented by Formulae (Ar-1) to (Ar-7), provided that in a case where q1 is 2, a plurality of Ar's may be the same as or different from each other,

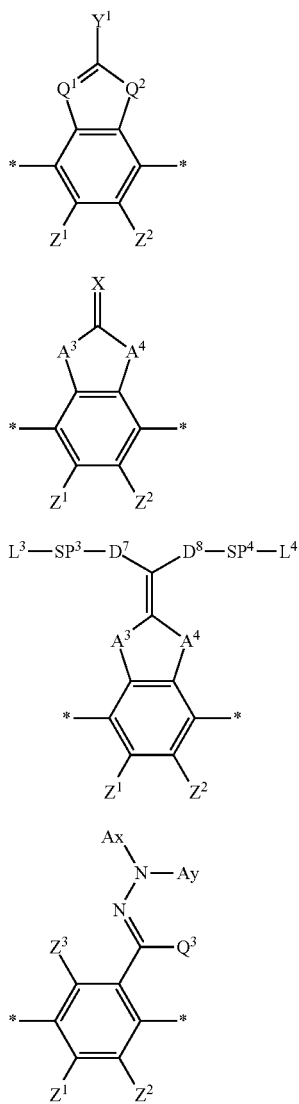

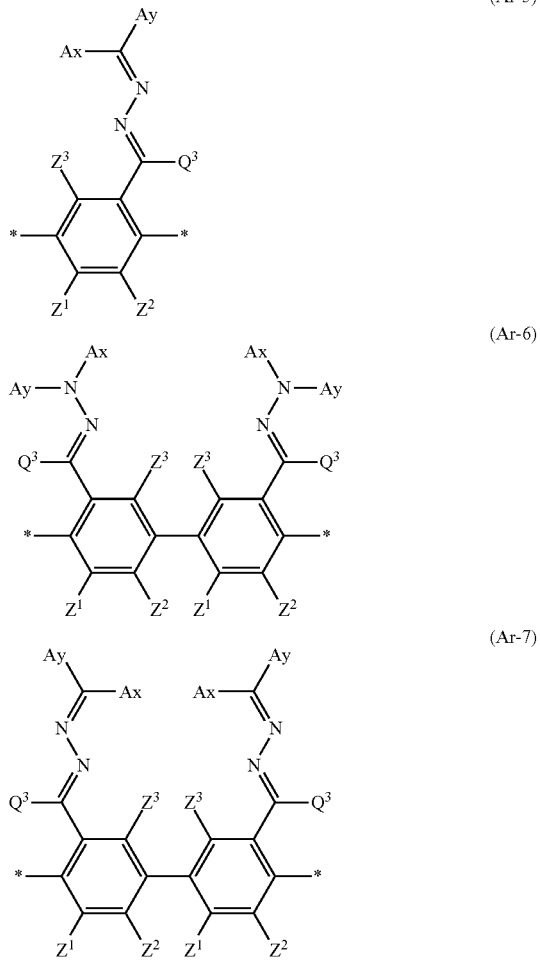

in Formulae (Ar-1) to (Ar-7),

* represents a bonding position to D$^1$ or D$^2$,

Q$^1$ represents N or CH,

Q$^2$ represents —S—, —O—, or —N(R$^6$)—, where R$^6$ represents a hydrogen atom or an alkyl group having 1 to 6 carbon atoms, Y$^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —CH$_2$—'s constituting the alicyclic hydrocarbon group may be substituted with —O—, —S—, or —NH—, Z$^1$, Z$^2$, and Z$^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —OR$^7$, —NR$^8$R$^9$, —SR$^{10}$, —COOR$^{11}$, or —COR$^{12}$, R$^7$ to R$^{12}$ each independently represent a hydrogen atom or an alkyl group having 1 to 6 carbon atoms, and Z$^1$ and Z$^2$ may be bonded to each other to form an aromatic ring, A³ and A⁴ each independently represent a group selected from the group consisting of —O—, —N(R¹³)—, —S—, and —CO—, where R¹³ represents a hydrogen atom or a substituent, X represents a non-metal atom of Groups XIV to XVI to which a hydrogen atom or a substituent may be bonded, D⁷ and D⁸ each independently represent a single bond; or —CO—, —O—, —S—, —C(=S)—, —CR¹R²—, —CR³=CR⁴—, —NR⁵—, or a divalent linking group consisting of a combination of two or more of these groups, where R¹ to R⁵ each independently represent a hydrogen atom, a fluorine atom, or an alkyl group having 1 to 12 carbon atoms, SP³ and SP⁴ each independently represent a single bond, a linear alkylene group having 1 to 12 carbon atoms, a branched alkylene group having 3 to 12 carbon atoms, or a divalent linking group in which one or more of —CH₂—'s constituting the linear or branched alkylene group are substituted with —O—, —S—, —NH—, —N(Q)-, or —CO—, where Q represents a substituent, L³ and L⁴ each independently represent a monovalent organic group, and at least one of L³ or L⁴, or L¹ or L² in Formula (I) represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and Q³ represents a hydrogen atom or an alkyl group having 1 to 20 carbon atoms, which may have a substituent.

2. The optically anisotropic layer according to claim 1, wherein the liquid crystal state is a smectic phase.

3. The optically anisotropic layer according to claim 1, wherein the amplitude value L at a wavelength of 5.0 μm or more is 0.235 or more.

4. The optically anisotropic layer according to claim 1, wherein the monofunctional compound is a compound represented by Formula (II), wherein the number D1 of atoms of the polymerizable liquid crystal compound and the number D2 of atoms of the monofunctional compound satisfy a relationship of Expression (1), L⁵-SP⁵-D⁹-(A⁵)_{a3}-D¹⁰-(G³)_{g3}-D¹¹-M  (II)

in Formula (II), a3 and g3 each independently represent an integer of 0 to 2, provided that a3 and g3 represent integers of 1 to 3 in total, D⁹, D¹⁰, and D¹¹ each independently represent a single bond; or —CO—, —O—, —S—, —C(=S)—, —CR¹R²—, —CR³=CR⁴—, —NR⁵—, or a divalent linking group consisting of a combination of two or more of these groups, where R¹ to R⁵ each independently represent a hydrogen atom, a fluorine atom, or an alkyl group having 1 to 12 carbon atoms, G³ represents an aromatic ring having 6 to 20 carbon atoms, which may have a substituent, or a divalent alicyclic hydrocarbon group having 5 to 20 carbon atoms, which may have a substituent, and one or more of —CH₂—'s constituting the alicyclic hydrocarbon group may be substituted with —O—, —S—, or —NH—, provided that in a case where g3 is 2, a plurality of G³'s may be the same as or different from each other, A⁵ represents an aromatic ring having 6 to 20 carbon atoms, which may have a substituent, or a divalent alicyclic hydrocarbon group having 5 to 20 carbon atoms, which may have a substituent, and one or more of —CH₂—'s constituting the alicyclic hydrocarbon group may be substituted with —O—, —S—, or —NH—, provided that in a case where a3 is 2, a plurality of A⁵'s may be the same as or different from each other, SP⁵ represents a single bond, a linear alkylene group having 1 to 12 carbon atoms, a branched alkylene group having 3 to 12 carbon atoms, or a divalent linking group in which one or more of —CH₂—'s constituting the linear or branched alkylene group are substituted with —O—, —S—, —NH—, —N(Q)-, or —CO—, where Q represents a substituent, L⁵ represents a polymerizable group, and M represents an aromatic ring which may have a substituent,

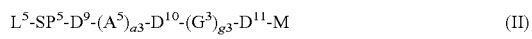

$$0.35 \leq D2/D1 \leq 0.45 \quad (1)$$

wherein in Expression (1), the number D1 of atoms of the polymerizable liquid crystal compound represents a number of atoms from a starting atom in L¹ to an ending atom in L² of the polymerizable liquid crystal compound at a shortest distance from the starting atom to the ending atom, not including hydrogen atoms in a count of the number D1 of atoms, and the number D2 of atoms of the monofunctional compound represents a number of atoms from a starting atom in L⁵ to an ending atom in M of the monofunctional compound at a shortest distance from the starting atom to the ending atom, not including hydrogen atoms, in a count of the number D2 of atoms, and wherein the starting atom in L¹ is the farthest atom in L¹ from SP¹, the ending atom in L² is the farthest atom in L² from SP², the starting atom in L⁵ is the farthest atom in L⁵ from SP⁵, and the ending atom in M is the farthest atom in M from D¹¹, provided that none of the starting atom in L¹, the ending atom in L², the starting atom in L⁵, and the ending atom in M are hydrogen atoms.

5. The optically anisotropic layer according to claim 1, wherein the optically anisotropic layer is a positive A plate.

6. An optical film comprising the optically anisotropic layer according to claim 1.

7. A polarizing plate comprising:
the optical film according to claim 6; and
a polarizer.

8. An image display device comprising the optical film according to claim 6.

9. An image display device comprising the polarizing plate according to claim 7.

10. The optically anisotropic layer according to claim 2, wherein the amplitude value L at a wavelength of 5.0 μm or more is 0.235 or more.

11. The optically anisotropic layer according to claim 2, wherein the optically anisotropic layer is a positive A plate.

12. An optical film comprising the optically anisotropic layer according to claim 2.

13. A polarizing plate comprising:
the optical film according to claim 12; and
a polarizer.

14. The optically anisotropic layer according to claim 1, wherein the monofunctional compound is a compound represented by Formula (II)

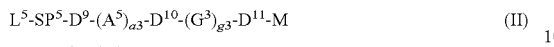

in Formula (II), a3 and g3 each independently represent an integer of 0 to 2, provided that a3 and g3 represent integers of 1 to 3 in total, $D^9$, $D^{10}$, and $D^{11}$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, $G^3$ represents an aromatic ring having 6 to 20 carbon atoms, which may have a substituent, or a divalent alicyclic hydrocarbon group having 5 to 20 carbon atoms, which may have a substituent, and one or more of —$CH_2$—'s constituting the alicyclic hydrocarbon group may be substituted with —O—, —S—, or —NH—, provided that in a case where g3 is 2, a plurality of $G^3$'s may be the same as or different from each other, $A^5$ represents an aromatic ring having 6 to 20 carbon atoms, which may have a substituent, or a divalent alicyclic hydrocarbon group having 5 to 20 carbon atoms, which may have a substituent, and one or more of —$CH_2$—'s constituting the alicyclic hydrocarbon group may be substituted with —O—, —S—, or —NH—, provided that in a case where a3 is 2, a plurality of $A^5$'s may be the same as or different from each other, $SP^5$ represents a single bond, a linear alkylene group having 1 to 12 carbon atoms, a branched alkylene group having 3 to 12 carbon atoms, or a divalent linking group in which one or more of —$CH_2$—'s constituting the linear or branched alkylene group are substituted with —O—, —S—, —NH—, —N(Q)-, or —CO—, where Q represents a substituent, $L^5$ represents a polymerizable group, and M represents an aromatic ring which may have a substituent.

15. The optically anisotropic layer according to claim 14, wherein M in Formula (II) represents an aromatic ring which does not have a substituent.

16. The optically anisotropic layer according to claim 14, wherein both of a3 and g3 in Formula (II) represent 1, and at least one of $A^5$ and $G^3$ in Formula (II) represent a divalent alicyclic hydrocarbon group having 5 to 20 carbon atoms, which may have a substituent.

17. The optically anisotropic layer according to claim 14, wherein both of a3 and g3 in Formula (II) represent 1, and $G^3$ in Formula (II) represents a divalent alicyclic hydrocarbon group having 5 to 20 carbon atoms, which may have a substituent.

* * * * *